US012813089B2

(12) United States Patent
Lee et al.

(10) Patent No.: US 12,813,089 B2
(45) Date of Patent: Nov. 24, 2026

(54) LIGHT EMITTING DISPLAY DEVICE THAT REDUCES DIFFRACTION PATTERNS WHILE EXTERNAL LIGHT IS REFLECTED

(71) Applicant: Samsung Display Co., LTD., Yongin-si (KR)

(72) Inventors: Jun Hee Lee, Yongin-si (KR); Kook Hyun Choi, Yongin-si (KR); Seong-Yong Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 18/506,692

(22) Filed: Nov. 10, 2023

(65) Prior Publication Data

US 2024/0244890 A1 Jul. 18, 2024

(30) Foreign Application Priority Data

Jan. 18, 2023 (KR) ........................ 10-2023-0007348

(51) Int. Cl.
*H10K 59/122* (2023.01)
*H10K 50/13* (2023.01)
*H10K 59/38* (2023.01)

(52) U.S. Cl.
CPC ........... *H10K 59/122* (2023.02); *H10K 50/13* (2023.02); *H10K 59/38* (2023.02)

(58) Field of Classification Search
CPC ...... H10K 59/122; H10K 50/13; H10K 59/38; H10K 50/865; H10K 59/8792; H10K 59/126; H10K 59/8051; H10K 59/8052; H10K 59/873
See application file for complete search history.

(56) References Cited

U.S. PATENT DOCUMENTS

| | | | | |
|---|---|---|---|---|
| 2019/0013363 A1 | 1/2019 | Lee et al. | | |
| 2019/0165061 A1* | 5/2019 | Jung | ..................... | G06F 3/0412 |
| 2020/0073495 A1* | 3/2020 | Bok | ..................... | G06F 3/0443 |
| 2021/0255511 A1* | 8/2021 | Kuo | ..................... | G02B 5/003 |
| 2022/0199731 A1* | 6/2022 | Jeong | ..................... | H10K 59/126 |
| 2024/0040848 A1 | 2/2024 | Hwang et al. | | |

(Continued)

FOREIGN PATENT DOCUMENTS

| | | |
|---|---|---|
| JP | 2020-13695 A | 1/2020 |
| KR | 10-1913455 B1 | 10/2018 |

(Continued)

*Primary Examiner* — Tracie Y Green

(74) *Attorney, Agent, or Firm* — Womble Bond Dickinson (US) LLP

(57) ABSTRACT

A light emitting display device includes: a substrate; anodes on the substrate; a pixel definition layer having first openings overlapping with the anodes, respectively; emission layers located within the first openings, respectively; a cathode on the emission layers and the pixel definition layer; an encapsulation layer on the cathode; and a light blocking layer on the encapsulation layer, and having second openings corresponding to the first openings, respectively. Each of the first openings has a circular shape in a plan view, and each of the second openings has an elliptical shape in a plan view. In a plan view, a first opening from among the first openings is in contact with a second opening corresponding to the first opening from among the second openings, or positioned within the second opening.

20 Claims, 24 Drawing Sheets

(56) References Cited

U.S. PATENT DOCUMENTS

| | | | |
|---|---|---|---|
| 2024/0049516 | A1 | 2/2024 | Lee et al. |
| 2024/0057391 | A1 | 2/2024 | Lee |
| 2024/0244891 | A1 | 7/2024 | Choi et al. |

FOREIGN PATENT DOCUMENTS

| | | | |
|---|---|---|---|
| KR | 10-2019-0004874 | A | 1/2019 |
| KR | 10-2203421 | B1 | 1/2021 |
| KR | 10-2022-0041288 | A | 4/2022 |
| KR | 10-2024-0015206 | A | 2/2024 |
| KR | 10-2024-0015811 | A | 2/2024 |
| KR | 10-2024-0023305 | A | 2/2024 |
| KR | 10-2024-0115381 | A | 7/2024 |

* cited by examiner (A)

(B)

(A)

(B)

LIGHT EMITTING DISPLAY DEVICE THAT REDUCES DIFFRACTION PATTERNS WHILE EXTERNAL LIGHT IS REFLECTED

CROSS-REFERENCE TO RELATED APPLICATION

This application claims priority to and the benefit of Korean Patent Application No. 10-2023-0007348, filed in the Korean Intellectual Property Office on Jan. 18, 2023, the entire content of which is incorporated by reference herein.

BACKGROUND

1. Field

Aspects of embodiments of the present disclosure relate to a light emitting display device.

2. Description of the Related Art

A display device is a device for displaying an image, and includes a liquid crystal display (LCD), an organic light emitting diode (OLED) display, and the like. The display device is used in various electronic devices, such as a mobile phone, a navigation device, a digital camera, an electronic book, a portable game machine, and various terminals.

The display device, such as the organic light emitting display device, may have a structure in which the display device may be bent or folded by using a flexible substrate.

In addition, in small electronic devices, such as portable phones, optical elements, such as cameras and optical sensors, are formed in a bezel area, which is a peripheral area of the display area. However as the size of the peripheral area of the display area is gradually reduced while the size of the screen for display is increased, technology that allows the cameras or the optical sensors to be positioned on the back of the display area is being developed.

The above information disclosed in this Background section is for enhancement of understanding of the background of the present disclosure, and therefore, it may contain information that does not constitute prior art.

SUMMARY

One or more embodiments of the present disclosure are directed to a display device that may reduce diffraction patterns that may be generated while external light is reflected. One or more embodiments of the present disclosure are directed to a light emitting display device in which a color separation of external light may properly occur, or a constant or substantially constant diffraction pattern may occur regardless of an angle.

According to one or more embodiments of the present disclosure, a light emitting display device includes: a substrate; a plurality of anodes on the substrate; a pixel definition layer having a plurality of first openings overlapping with the plurality of anodes, respectively; a plurality of emission layers located within the plurality of first openings of the pixel definition layer, respectively; a cathode on the plurality of emission layers and the pixel definition layer; an encapsulation layer on the cathode; and a light blocking layer on the encapsulation layer, and having a plurality of second openings corresponding to the plurality of first openings, respectively. Each of the plurality of first openings has a circular shape in a plan view, and each of the plurality of second openings has an elliptical shape in a plan view. In a plan view, a first opening from among the plurality of first openings is in contact with a second opening corresponding to the first opening from among the plurality of second openings, or positioned within the second opening.

In an embodiment, a half value of a long axis length of the elliptical shape of the second opening may be greater than a radius value of the circular shape of the first opening by 4.5 μm or more and 10 μm or less.

In an embodiment, the plurality of second openings may have long axis angles including five or more directions.

In an embodiment, an angle formed by long axis directions of each ellipse for two second openings from among the plurality of second openings may be 36 degrees or less.

In an embodiment, the plurality of second openings may have long axis directions of eight angles, and an angular interval of 22.5 degrees.

In an embodiment, the plurality of second openings may have long axis directions with 16 angles, and an angular interval of 11.25 degrees.

In an embodiment, each of the plurality of second openings may have an eccentricity greater than or equal to 0.2 and less than or equal to 0.85.

In an embodiment, the light emitting display device may further include a color filter located within each of the plurality of second openings. The color filter may include a color filter for a first color, a color filter for a second color, and a color filter for a third color. Two second openings from among the plurality of second openings corresponding to the color filter of the same color as each other may have different eccentricities from each other.

In an embodiment, the second opening may have a planar shape in which at least two elliptical shapes with different eccentricities from each other are merged together in a plan view.

In an embodiment, the second opening may have the planar shape formed by combining a first ellipse with a first eccentricity and a second ellipse with a second eccentricity together after cutting them along a first direction.

According to one or more embodiments of the present disclosure, a light emitting display device includes: a substrate; a plurality of anodes on the substrate; a pixel definition layer having a plurality of first openings overlapping with the plurality of anodes, respectively; a plurality of emission layers located within the plurality of first openings of the pixel definition layer, respectively; a cathode on the plurality of emission layers and the pixel definition layer; an encapsulation layer on the cathode; and a light blocking layer on the encapsulation layer, and having a plurality of second openings corresponding to the plurality of first openings, respectively. Each of the plurality of first openings has a circular shape in a plan view, and each of the plurality of second openings has an elliptical shape in a plan view. A portion of a first opening from among the plurality of first openings overlaps with a second opening corresponding to the first opening from among the plurality of second openings, while other portions of the first opening overlaps with the light blocking layer.

In an embodiment, a half value of a long axis length of the elliptical shape of the second opening may be greater than a radius value of the circular shape of the first opening by 4.5 μm or more and 10 μm or less.

In an embodiment, the plurality of second openings may have long axis angles including five or more directions.

In an embodiment, an angle formed by long axis directions of each ellipse of two second openings from among the plurality of second openings may be 36 degrees or less.

In an embodiment, the plurality of second openings may have long axis directions of eight angles, and an angular interval of 22.5 degrees.

In an embodiment, the plurality of second openings may have long axis directions with 16 angles, and an angular interval of 11.25 degrees.

In an embodiment, each of the plurality of second openings may have an eccentricity greater than or equal to 0.2 and less than or equal to 0.85.

In an embodiment, the light emitting display device may further include a color filter located within each of the plurality of second openings, and the color filter may include a color filter for a first color, a color filter for a second color, and a color filter for a third color. Two second openings from among the plurality of second openings corresponding to the color filter of the same color as each other may have different eccentricities from each other.

In an embodiment, the second opening may have a planar shape in which at least two elliptical shapes with different eccentricities from each other are merged together in a plan view.

In an embodiment, the second opening may have the planar shape formed by combining a first ellipse with a first eccentricity and a second ellipse with a second eccentricity together after cutting them along a first direction According to one or more embodiments of the present disclosure, a diffraction pattern may be reduced by reducing a ratio at which external light is reflected by using a pixel definition layer that separates the emission layers from each other as a black pixel definition layer instead of a polarizer.

According to one or more embodiments of the present disclosure, an opening of the pixel definition layer may be formed in a circular shape, and an opening of a light blocking layer may be formed in an elliptical shape, so that reflection and diffraction phenomena occurring at the opening side wall of the pixel definition layer may be reduced.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
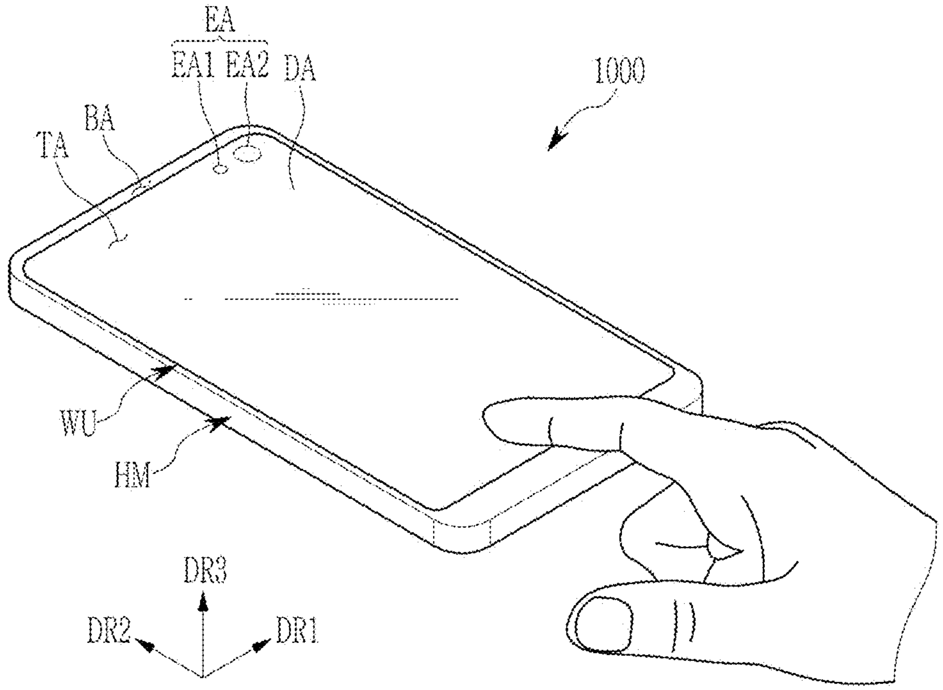
FIG. 1 is a schematic perspective view showing a use state of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be 1 otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used, in the present specification, the phrases "on a plane" and "in a plan view" means when an object portion is viewed from above, and the phrases "on a cross-section" and "in a cross-sectional view" means when a cross-section taken by vertically cutting an object portion is viewed from the side.

Further, throughout the specification, when it is described that parts such as wires, layers, films, areas, plates, and constituent elements are "extended in the first direction or second direction", this does not mean only a straight-line shape extending straight in the corresponding direction, but it is a structure that extends overall along the first direction or the second direction, and includes a structure that is bent and has a zigzag structure in a part, or includes extending while including a curved line structure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. Further, as used in the present specification, the terms "on" or "above" means positioned on or below the object portion, and does not necessarily mean positioned on the upper side of the object portion based on a gravitational direction. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

The electronic or electric devices and/or any other relevant devices or components according to embodiments of the present disclosure described herein (e.g., the various modules and the like) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

In addition, electronic devices including display devices and display panels described in the present specification (e.g., mobile phones, TV, monitors, laptop computers, etc.) or display devices and electronic devices including display panels and the like manufactured by the manufacturing methods described in the present specification are not excluded from the right range of this specification.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A schematic structure of a display device is first described hereinafter with reference to FIG. 1 to FIG. 3.

FIG. 1 is a schematic perspective view showing a use state of a display device according to an embodiment. FIG. 2 is an exploded perspective view of a display device according to an embodiment. FIG. 3 is a block diagram of a display device according to an embodiment.

Referring to FIG. 1, a display device 1000 according to an embodiment is a device for displaying a motion picture or a still image, and may be used as a display screen of various suitable products, such as a television, a laptop, a monitor, an advertisement board, an Internet of things (IOT) device, and/or the like, as well as for various suitable portable electronic devices, such as a mobile phone, a smart phone, a tablet personal computer, a mobile communication terminal, an electronic notebook, an e-book, a PMP (portable multimedia player), a navigation device, a UMPC (Ultra Mobile PC), and/or the like. In addition, the display device 1000 according to an embodiment may be used in a wearable device, such as a smart watch, a watch phone, a glasses display, and/or a head mounted display (HMD. In addition, the display device 1000 according to an embodiment may be used as an instrument panel of a car, a center fascia of the car, a CID (Center Information Display) disposed on a dashboard, a room mirror display that replaces a side mirror of the car, an entertainment device for a rear seat of the car, and/or a display disposed on the rear surface of the front seat of the car. FIG. 1 shows that the display device 1000 is used as a smartphone for convenience of comprehension and ease of description.

The display device 1000 may display an image in a third direction DR3 on a display surface parallel to or substantially parallel to each of a first direction DR1 and a second direction DR2. The display surface on which the image is displayed may correspond to the front surface of the display device 1000, and may correspond to the front surface of a cover window WU of the display device 1000. The images may include static images as well as dynamic images.

In the present embodiment, a front surface (e.g., an upper surface) and a rear surface (e.g., a lower surface) of each member are defined based on the direction in which the image is displayed. The front surface and the rear surface may be opposite to each other in the third direction DR3, and the normal directions of each of the front and the rear surfaces may be parallel to the third direction DR3. The separation distance in the third direction DR3 between the front surface and the rear surface may correspond to the thickness in the third direction DR3, such as that of the display panel of the display device 1000.

The display device 1000 according to an embodiment may detect an input (e.g., referring to a hand in FIG. 1) of a user applied from the outside. The input of the user may include various suitable kinds of external inputs, such as a part of the user's body, light, heat, or pressure. In an embodiment, the user's input is shown in FIG. 1 with the user's hand applied to the front (e.g., the front surface) of the display device 1000. However, the present disclosure is not limited thereto. The user's input may be provided in various suitable forms, and the display device 1000 may also sense the user's input applied to the side surface or the rear surface of the display device 1000 according to the structure of the display device 1000.

Figure 2:
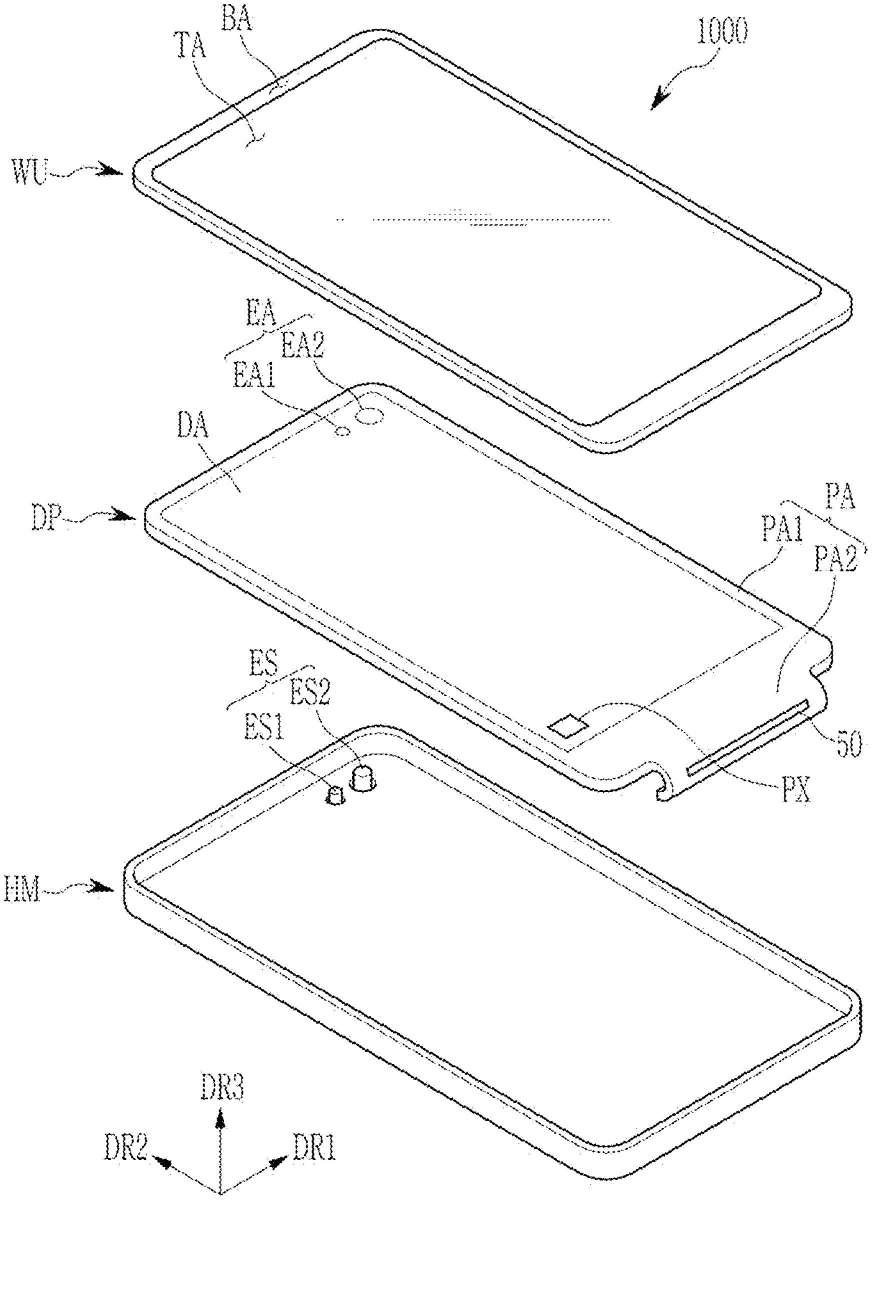
FIG. 2 is an exploded perspective view of a display device according to an embodiment.

Referring to FIG. 1 and FIG. 2, the display device 1000 may include the cover window WU, a housing HM, a display panel DP, and an optical element ES. In an embodiment, the cover window WU and the housing HM may be combined with each other to constitute the appearance (e.g., the outer appearance) of the display device 1000.

The cover window WU may include an insulating panel. For example, the cover window WU may be made of glass, plastic, or a suitable combination thereof.

The front surface of the cover window WU may define the front surface of the display device 1000. The cover window WU may include a transmissive area TA and a blocking area BA. The transmissive area TA may be an optically transparent area. For example, the transmissive area TA may be an area having a visible ray transmittance of about 90% or more.

The blocking area BA may define the shape of the transmissive area TA. The blocking area BA is adjacent to the transmissive area TA, and may surround (e.g., around a periphery of) the transmissive area TA. The blocking area BA may be an area having a relatively low light transmittance compared to that of the transmissive area TA. The blocking area BA may include an opaque material that blocks light. The blocking area BA may have a suitable color (e.g., a predetermined color). The blocking area BA may be defined by a bezel layer provided separately from the transparent substrate defining the transmissive area TA, or may be defined by an ink layer formed by inserting or coloring the ink layer into or onto the transparent substrate.

The display panel DP may include a display area DA for displaying an image, and a driving unit 50 (e.g., a driver or a driving circuit). A display pixel PX is positioned in the display area DA and a component area EA. The display panel DP may include the front surface including the display area DA and a non-display area PA. In an embodiment, the display area DA and the component area DA are areas in which the image is displayed by including the pixel PX, and may be an area in which an external input is sensed by concurrently or substantially simultaneously positioning a touch sensor on the upper side in the third direction DR3 of the pixel PX.

The transmissive area TA of the cover window WU may at least partially overlap with at least a part of the display area DA and the component area EA of the display panel DP. For example, the transmissive area TA may overlap with the entire surface of the display area DA and the component area EA, or at least a part of the display area DA and the component area EA. Accordingly, the user may recognize the image through the transmissive area TA and/or provide the external input based on the image. However, the present disclosure is not limited thereto. For example, an area in which the image is displayed and an area in which the external input is detected may be separated from each other.

The non-display area PA of the display panel DP may at least partially overlap with the blocking area BA of the cover window WU. The non-display area PA may be an area covered by the blocking area BA. The non-display area PA may be adjacent to the display area DA, and may surround (e.g., around a periphery of) the display area DA. The image is not displayed in the non-display area PA, and a driving circuit and/or a driving wiring for driving the display area DA may be disposed in the non-display area PA. The non-display area PA may include a first peripheral area PA1 positioned outside the display area DA, and a second peripheral area PA2 including a driving part (e.g., a driver or a driving circuit) 50, a connection wiring, and a bending area. In the embodiment of FIG. 2, the first peripheral area PA1 is positioned on three sides of the display area DA, and the second peripheral area PA2 is positioned on the other remaining side of the display area DA.

In an embodiment, the display panel DP may be assembled in a flat state in which the display area DA, the component area EA, and the non-display area PA face the cover window WU. However, the present disclosure is not limited thereto. A part of the non-display area PA of the display panel DP may be bent. In this case, a portion of the non-display area PA faces the rear surface of the display device 1000, so that the blocking area BA shown on the front surface of the display device 1000 may be reduced. For example, as shown in FIG. 2, the second peripheral area PA2 may be bent to be positioned on the rear surface of the display area DA, and then assembled.

In addition, the component area EA of the display panel DP may include a first component area EA1 and a second component area EA2. The first component area EA1 and the second component area EA2 may be at least partially surrounded (e.g., around peripheries thereof) by the display area DA. Although the first component area EA1 and the second component area EA2 are shown to be spaced apart from each other, the present disclosure is not limited thereto, and at least two component areas may be connected to each other. The first component area EA1 and the second component area EA2 may be areas in which an optical element (e.g., referring to ES of FIG. 2; hereinafter, referred to as a component) using infrared rays, visible rays, or sound is disposed below (e.g., underneath) the first component area EA1 and the second component area EA2.

In the display area DA (hereinafter referred to as a main display area) and the component area EA, a plurality of light emitting diodes (LEDs) and a plurality of pixel circuit parts (e.g., pixel circuits) are formed. The plurality of pixel circuit parts generate and transmit a light emitting current to the plurality of light emitting diodes (LEDs). Here, one light emitting diode LED and one pixel circuit part (e.g., one pixel circuit) are referred to as the pixel PX. In the display area DA and the component area EA, one pixel circuit part and one light emitting diode LED are formed one-to-one.

The first component area EA1 may include a transmissive part through which light and/or sound may pass, and a display part including a plurality of pixels. The transmissive part is positioned between adjacent pixels, and is composed of a layer through which light and/or sound may pass. The transmissive part may be positioned between the adjacent pixels, and a layer that does not transmit light, such as a light blocking layer, may overlap with the first component area EA1 according to one or more embodiments. The number of the pixels (hereinafter, also referred to as a resolution) per unit area of the pixels (hereinafter referred to as normal pixels) included in the display area DA and the number of the pixels per unit area of the pixels (hereinafter, referred to as first component pixels) included in the first component area EA1 may be the same or substantially the same as each other.

The second component area EA2 includes an area (hereinafter referred to as a light transmissive area) composed of a transparent layer to allow light to pass through. The light transmissive area does not include a conductive layer or a semiconductor layer. A layer including a light-blocking material, for example, a pixel definition layer and/or a light blocking layer, includes an opening overlapping with a position corresponding to the second component area EA2. As such, the second component area EA2 may have a structure in which light is not blocked. The number of the pixels per unit area of the pixels (hereinafter, referred to as second component pixels) included in the second component area EA2 may be smaller than the number of the pixels per unit area of the normal pixels included in the display area DA. As a result, the resolution of the second component pixels may be lower than that of the normal pixels.

Figure 3:
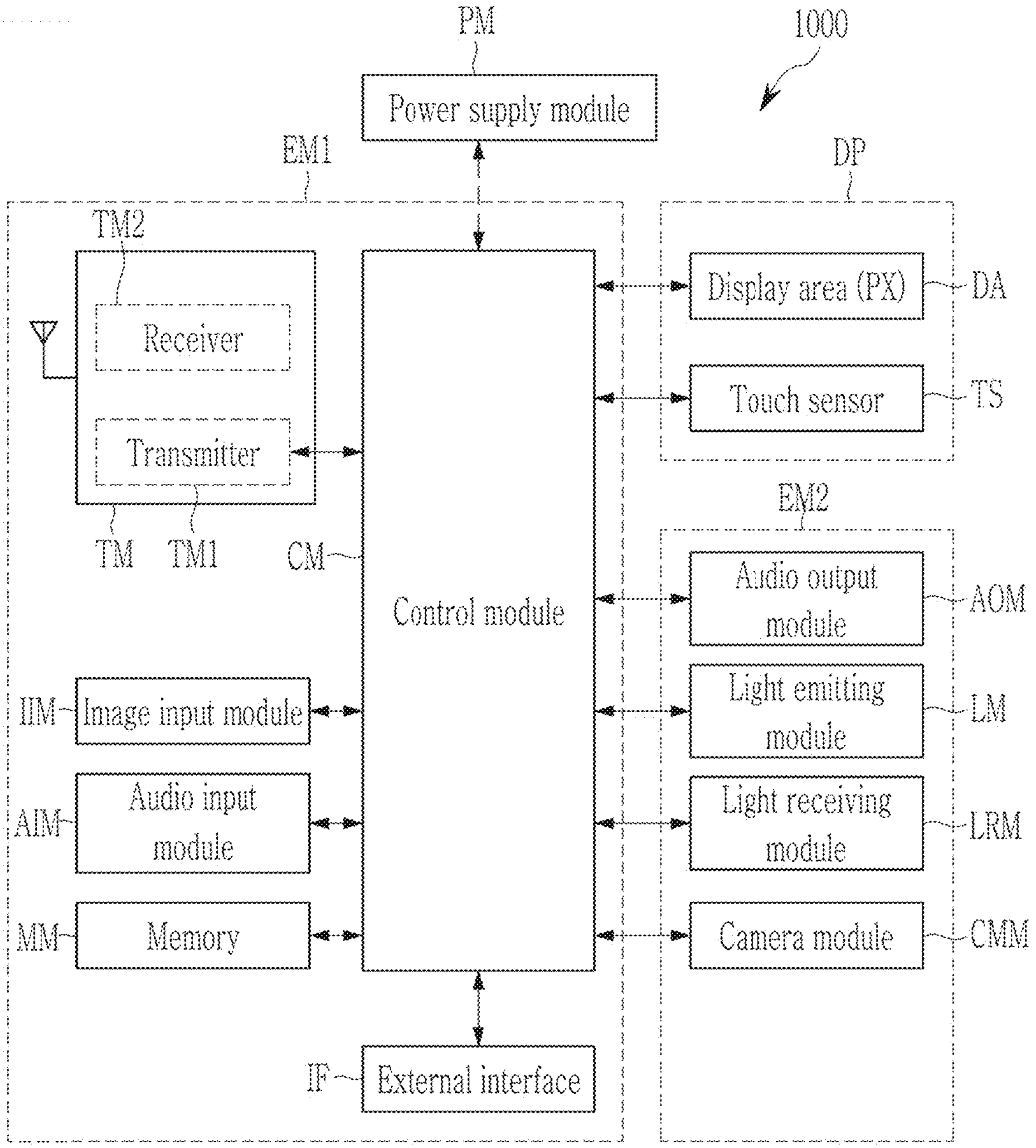
FIG. 3 is a block diagram of a display device according to an embodiment.

Referring to FIG. 3, the display panel DP may further include a touch sensor TS in addition to the display area DA including the display pixel PX. The display panel DP may be recognized by the user from the outside through the transmissive area TA by including the pixel PX, which is a component that creates an image. In addition, the touch sensor TS may be positioned on top of the pixel PX, and may detect an external input applied from the outside. The touch sensor TS may detect the external input provided to the cover window WU.

Referring again to FIG. 2, the second peripheral area PA2 may include a bending part. The display area DA and the first peripheral area PA1 may have a flat state that is substantially parallel to the plane defined by the first direction DR1 and the second direction DR2, and one side of the second peripheral area PA2 may extend from the flat state and have a flat state again after the bending part. As a result, at least a part of the second peripheral area PA2 may be bent and assembled to be positioned on the rear surface side of the display area DA. At least a portion of the second peripheral area PA2 overlaps with the display area DA on a plane (e.g., in a plan view) when being assembled, so that the blocking area BA of the display device 1000 may be reduced. However, the present disclosure is not limited thereto. For example, the second peripheral area PA2 may not be bent.

The driving part 50 may be mounted on the second peripheral area PA2, and may be mounted on the bending part or positioned on one of opposite sides of the bending part. The driving part 50 may be provided in a form of a chip.

The driving part 50 may be electrically connected to the display area DA and the component area EA, and may transmit electrical signals to the pixels PX of the display area DA and the component area EA. For example, the driving part 50 may provide data signals to the pixels PX disposed in the display area DA. As another example, the driving part 50 may include a touch driving circuit, and may be electrically connected to the touch sensor TS disposed in the display area DA and/or the component area EA. The driving part 50 may be designed to include various suitable circuits, in addition to the above-described circuits, and/or to provide various suitable electrical signals to the display area DA.

A pad part may be positioned at an end of the second peripheral area PA2, and the display device 1000 may be electrically connected to a flexible printed circuit board (FPCB) including a driving chip by the pad part. Here, the driving chip positioned on the flexible printed circuit board may include various suitable driving circuits for driving the display device 1000 and/or connectors for power supply. According to an embodiment, instead of the flexible printed circuit board, a rigid printed circuit board (PCB) may be used.

The optical element ES may be disposed under the display panel DP. The optical element ES may include a first optical element ES1 overlapping with the first component area EA1, and a second optical element ES2 overlapping with the second component area EA2. The first optical element ES1 may use infrared rays, and in this case, a layer that does not transmit light, such as a light blocking layer, may overlap with the first component area EA1.

The first optical element ES1 may be an electronic element using light or sound. For example, the first optical element ES1 may be a sensor that receives and uses light, such as an infrared sensor, a sensor that outputs and senses light or sound to measure a distance or recognize a fingerprint, a small lamp that outputs light, a speaker that outputs sound, or the like. In the case of the electronic element using light, light of various suitable wavelength bands, such as visible light, infrared light, and/or ultraviolet light, may be used.

The second optical element ES2 may include (e.g., may be) at least one of a camera, an infrared camera (e.g., an IR camera), a dot projector, an infrared illuminator, or a time-of-flight sensor (e.g., a ToF sensor).

Referring again to FIG. 3, the display device 1000 may include the display panel DP, a power supply module (e.g., a power supply) PM, a first electronic module (e.g., a first electronic device or circuit) EM1, and a second electronic module (e.g., a second electronic device or circuit) EM2. The display panel DP, the power supply module PM, the first electronic module EM1, and the second electronic module EM2 may be electrically connected to each other. In FIG. 3, the display pixel PX and the touch sensor TS positioned in the display area DA from among the configurations of the display panel DP are shown as an example.

The power supply module PM may supply power used for the overall operation of the display device 1000. The power supply module PM may include a typical battery module (e.g., a battery).

The first electronic module EM1 and the second electronic module EM2 may include various suitable functional modules for operating the display device 1000. The first electronic module EM1 may be directly mounted on the motherboard, electrically connected to the display panel DP, or mounted on a separate substrate and electrically connected to the motherboard through a connector.

The first electronic module EM1 may include a control module (e.g., a controller) CM, a wireless communication module (e.g., a wireless communication device or circuit) TM, an image input module (e.g., an image input device or circuit) IIM, an audio input module (e.g., an audio input device or circuit) AIM, memory MM, and an external interface IF. Some of the modules are not mounted on the motherboard, and may be electrically connected to the motherboard through a flexible printed circuit board connected thereto.

The control module CM may control the overall operations of the display device 1000. The control module CM may include (e.g., may be) a microprocessor. For example, the control module CM activates or deactivates the display panel DP. The control module CM may control the other modules, such as the image input module IIM or the audio input module AIM, based on the touch signal received from the display panel DP.

The wireless communication module TM may transmit/receive a wireless signal with other terminals using a Bluetooth or Wi-Fi line. The wireless communication module TM may transmit/receive voice signals by using a general communication line. The wireless communication module TM includes a transmitter TM1 that modulates and transmits a signal, and a receiver TM2 that demodulates a received signal.

The image input module IIM may process the image signal to be converted into image data that may be displayed on the display panel DP. The audio input module AIM may receive an external sound signal by a microphone in a recording mode, a voice recognition mode, and/or the like to be converted into electrical voice data.

The external interface IF may serve as an interface connected to an external charger, a wired/wireless data port, or a card socket (e.g., a memory card or a SIM/UIM card).

The second electronic module EM2 may include an audio output module (e.g., an audio output device or circuit) AOM, a light emitting module (e.g., a light emitting device or circuit) LM, a light receiving module (e.g., a light receiving module or circuit) LRM, and a camera module (e.g., a camera) CMM. At least some of these modules may correspond to the optical elements ES, and as shown in FIG. 1 and FIG. 2, may be positioned on the rear surface of the display panel DP. The optical element ES may include the light emitting module LM, the light receiving module LRM, and/or the camera module CMM. In addition, the second electronic module EM2 may be directly mounted on the motherboard, or may mounted on a separate substrate and electrically connected to the display panel DP through a connector, and/or electrically connected to the first electronic module EM1.

The audio output module AOM may convert audio data received from the wireless communication module TM or audio data stored in the memory MM, and may output the converted audio data to the outside.

The light emitting module LM may generate and output light. The light emitting module LM may output infrared light. For example, the light emitting module LM may include an LED element. For example, the light receiving module LRM may detect infrared rays. The light receiving module LRM may be activated when infrared rays above a threshold level (e.g., a predetermined level) are detected. The light receiving module LRM may include a CMOS sensor. After the infrared rays generated by the light emitting module LM are output, they are reflected by an external subject (e.g., a user's finger or a face), and the reflected infrared rays may be incident on the light receiving module LRM. The camera module CMM may capture an external image.

In an embodiment, the optical element ES may additionally include a light sensor or a thermal sensor. The optical element ES may detect an external object received through the front surface, or may provide a sound signal such as voice through the front surface to the outside. In addition, the optical element ES may include a plurality of components, and is not limited to any one embodiment.

Referring back to FIG. 2, the housing HM may be connected to (e.g., attached to or coupled with) the cover window WU. The cover window WU may be disposed on the front surface of the housing HM. The housing HM may be combined with the cover window WU to provide a suitable accommodation space (e.g., a predetermined accommodation space). The display panel DP and the optical element ES may be accommodated in the accommodation space provided between the housing HM and the cover window WU.

The housing HM may include a suitable material with relatively high stiffness. For example, the housing HM may include a plurality of frames and/or plates made of glass, plastic, metal, or a suitable combination thereof. The housing HM may reliably protect the components of the display device 1000 accommodated in the accommodation space (e.g., an interior space) from an external impact.

Hereinafter, a structure of the display device 1000 according to some embodiments is described in more detail with reference to FIG. 4.

Figure 4:
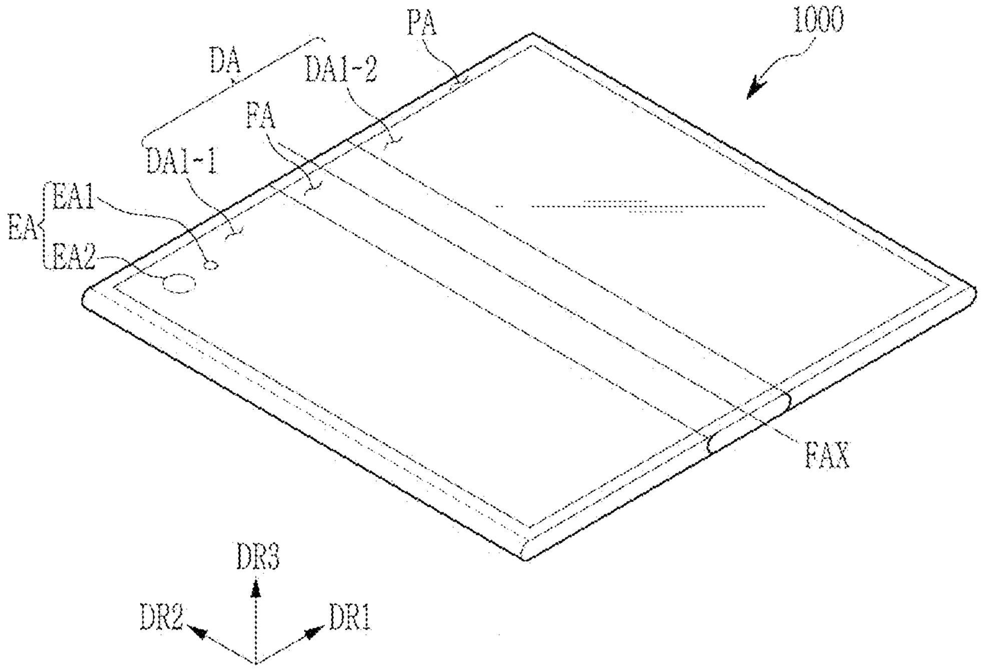
FIG. 4 is a perspective view schematically showing a light emitting display device according to an embodiment.

FIG. 4 is a perspective view schematically showing a light emitting display device according to an embodiment.

FIG. 4 shows a foldable display device having a structure in which the display device 1000 may be folded based on a folding axis FAX. Hereinafter, redundant description of the same or substantially the same components as those described are above may not be repeated, and the differences may be mainly described in more detail.

Referring to FIG. 4, the display device 1000 may be the foldable display device. The display device 1000 may be folded outwardly or inwardly based on the folding axis FAX. When being folded outward based on the folding axis FAX, the display surface of the display device 1000 is positioned on the outside in the third direction DR3, so that the images may be displayed in opposite directions. When being folded inward based on the folding axis FAX, the display surface may not be visually recognized from the outside.

In an embodiment, the display device 1000 may include a display area DA, a component area EA, and a non-display area PA. The display area DA may be divided into a first-first display area DA1-1, a first-second display area DA1-2, and a folding area FA. The first-first display area DA1-1 and the first-second display area DA1-2 may be positioned on the left and right sides, respectively, based on (e.g., the center of) the folding axis FAX, and the folding area FA may be positioned between the first-first display area DA1-1 and the first-second display area DA1-2. When being folded outward based on the folding axis FAX, the first-first display area DA1-1 and the first-second display area DA1-2 are positioned on opposite sides in the third direction DR3, and the images may be displayed in opposite directions. When being folded inward based on the folding axis FAX, the first-first display area DA1-1 and the first-second display area DA1-2 may not be visually recognized from the outside (e.g., may be folded to face each other).

Figure 5:
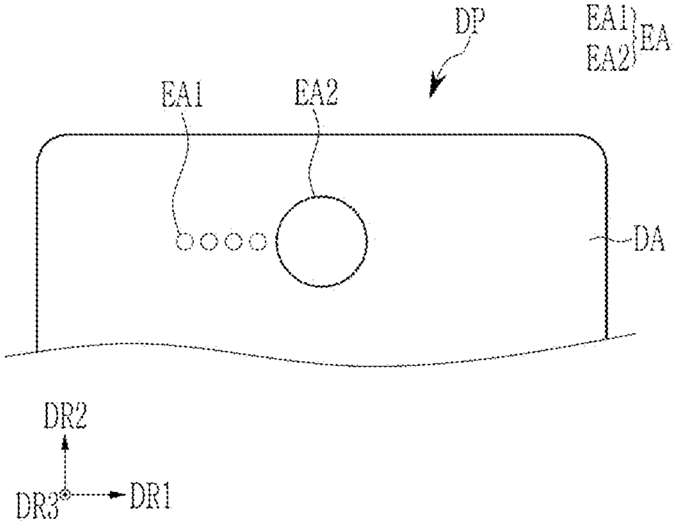
FIG. 5 is a top plan view showing an enlarged portion of an area of a light emitting display device according to an embodiment.

FIG. 5 is a top plan view showing an enlarged portion of an area (e.g., a partial area) of a light emitting display device according to an embodiment.

FIG. 5 shows a part of the light emitting display panel DP from among the light emitting display devices described above according to an embodiment, and shows a display panel for a mobile phone for convenience of illustration.

The display area DA is positioned on the front surface of the light emitting display panel DP, and the component area EA is positioned within the display area DA. In more detail, the component area EA may include a first component area EA1 and a second component area EA2. Additionally, in the embodiment of FIG. 5, the first component area EA1 is positioned to be adjacent to the second component area EA2. In the embodiment of FIG. 5, the first component area EA1 is positioned to the left of the second component area EA2. The position and number of first component areas EA1 may be variously modified as needed or desired. In FIG. 5, the optical element corresponding to the second component area EA2 may be a camera, and the optical element corresponding to the first component area EA1 may be an optical sensor.

A plurality of light emitting diodes LED and a plurality of pixel circuit parts (e.g., pixel circuits) for generating and transmitting a light emitting current to the plurality of light emitting diodes LED, respectively, are formed in the display area DA. Here, one light emitting diode LED and one pixel circuit part (e.g., one pixel circuit) are referred to as a pixel PX. In the display area DA, one pixel circuit part and one light emitting diode LED are formed one-to-one. The display area DA is hereinafter also referred to as 'a normal display area'. In FIG. 5, the structure of the light emitting display panel DP under the cut line is not shown, but the display area DA may also be positioned under the cut line.

The light emitting display panel DP according to an embodiment may be largely divided into a lower panel layer and an upper panel layer. The lower panel layer is a part where the light emitting diode (LED) and the pixel circuit part constituting the pixel are positioned, and may include an encapsulation layer (e.g., referring to 400 of FIG. 6) covering the light emitting diode (LED) and the pixel circuit part. In other words, the lower panel layer includes the layers from the substrate (e.g., referring to 110 in FIG. 6) to the encapsulation layer, and also includes an anode Anode, the pixel definition layer (e.g., referring to 380 in FIG. 6), an emission layer (e.g., referring to EML in FIG. 6), a spacer (e.g., referring to 385 in FIG. 6), a functional layer (e.g., referring to FL in FIG. 6), and a cathode (e.g., referring to Cathode in FIG. 6). The lower panel layer further includes an insulating layer, a semiconductor layer, and a conductive layer between the substrate and the anode.

The upper panel layer as a part positioned above the encapsulation layer, and includes a sensing insulating layer (e.g., referring to 501, 510, and 511 in FIG. 6), and a plurality of sensing electrodes (e.g., referring to 540 and 541 of FIG. 6) that may sense a touch. The upper panel layer may further include a light blocking layer (e.g., referring to 220 of FIG. 6), a color filter (e.g., referring to 230 of FIG. 6), and a planarization layer (e.g., referring to 550 of FIG. 6).

The first component area EA1 may include (may be composed of) a transparent layer (e.g., only a transparent layer) to allow light to pass through, and a conductive layer or a semiconductor layer may not be positioned in the first component area EA1 such that light is allowed to pass through. The lower panel layer may include a photosensor area, and an opening (hereinafter, referred to as an additional opening) may be formed at a position corresponding to the first component area EA1 in a pixel definition layer, the light blocking layer, and the color filter layer of the upper panel layer, thereby forming a structure that does not block light. Meanwhile, even if the photosensor area is positioned in the lower panel layer, if there is no opening corresponding to the upper panel layer, it may be the display area DA instead of the first component area EA1. One first component area EA1 may include a plurality of adjacent photosensor areas, and in this case, the pixels adjacent to the photosensor areas may be included in the first component area EA1. When the first optical element ES1 corresponding to the first component area EA1 uses infrared rays instead of visible rays, the first component area EA1 may overlap with the light blocking layer 220 that blocks visible rays.

The second component area EA2 may include a second component pixel and an optical transmissive area, and a space between adjacent second component pixels may correspond to (e.g., may be) the light transmissive area.

Although not illustrated in FIG. 5, the peripheral area PA may be further positioned outside the display area DA as described above. Also, FIG. 5 shows a display panel for a mobile phone, but the present embodiment may be applied as long as an optical element may be positioned on the rear surface of the display panel, and may also be the display panel for the flexible display device. In the case of the foldable display device from among the flexible display devices, the positions of the second component area EA2 and the first component area EA1 may be formed in positions different from those illustrated in FIG. 5.

Hereinafter, the structure of the light emitting display panel DP according to an embodiment is described in more detail with reference to FIG. 6.

Figure 6:
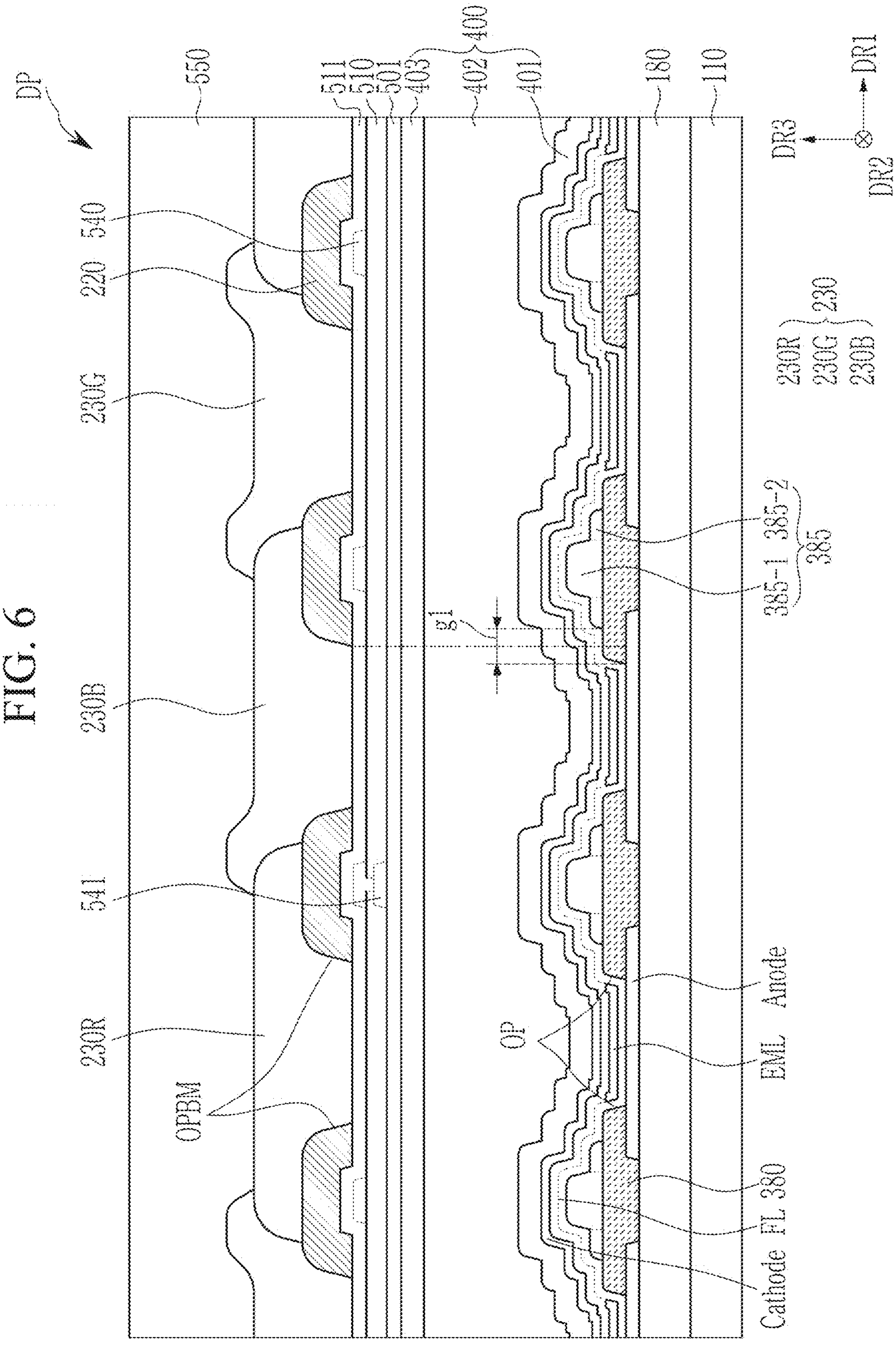
FIG. 6 is a schematic cross-sectional view of a display panel according to an embodiment.

FIG. 6 is a schematic cross-sectional view of a display panel according to an embodiment.

The light emitting display panel DP according to an embodiment may display an image by forming the light emitting diode (LED) on the substrate 110, detect a touch by including a plurality of detecting electrodes 540 and 541, and have a color characteristic of color filters 230R, 230G, and 230B due to light emitted from the light emitting diode (LED) by including a light blocking layer 220 and the color filters 230R, 230G, and 230B.

In addition, a polarizer may not be formed on the front surface of the light emitting display panel DP according to an embodiment, because a black pixel definition layer 380 is used instead, and the light blocking layer 220 and the color filter 230 are formed thereon. As such, even if external light is incident inside, it may be prevented from being reflected from an anode, such that reflected light may not be transmitted to the user.

The light emitting display panel DP according to an embodiment is described in more detail hereinafter.

The substrate 110 may include a suitable material such as glass that may not bend due to a rigid characteristic, or a flexible material such as plastic or polyimide that may be bent.

A plurality of thin film transistors are formed on the substrate 110, but is omitted in FIG. 6 for convenience of illustration, and an organic layer 180 covering the thin film transistors is shown in FIG. 6. In other words, the thin film transistors may be located between the substrate 110 and the organic layer 180. One pixel includes the light emitting diode (LED), and the pixel circuit part (e.g., the pixel circuit) including a plurality of transistors and capacitors that transmit a light emitting current to the light emitting diode (LED). In FIG. 6, the pixel circuit part is not shown for convenience of illustration, and the structure of the pixel circuit part may be variously modified as would be understood by those having ordinary skill in the art. FIG. 6 shows the organic layer 180 covering the pixel circuit part.

On the organic layer 180, the light emitting diode (LED) including an anode Anode, an emission layer EML, and a cathode Cathode is formed.

The anode Anode may be composed of a single layer including a transparent conductive oxide film and a metal material, or multilayers including these. The transparent conductive oxide film may include ITO (Indium Tin Oxide), poly-ITO, IZO (Indium Zinc Oxide), IGZO (Indium Gallium Zinc Oxide), and/or ITZO (Indium Tin Zinc Oxide), and the metal material may include silver (Ag), molybdenum (Mo), copper (Cu), gold (Au), aluminum (Al), and/or the like.

The emission layer EML may be formed of an organic light emitting material, and adjacent emission layers EML may display different colors from each other. However, the present disclosure is not limited thereto, and according to an embodiment, each of the emission layers EML may display light of the same or substantially the same color as each other due to the color filters 230R, 230G, and 230B positioned thereon. According to one or more embodiments, the emission layer EML may have a structure in which a plurality of emission layers is stacked (e.g., also referred to as a tandem structure).

On the organic layer 180 and the anode Anode, a pixel definition layer 380 is positioned, and the pixel definition layer 380 is formed with an opening OP overlapping with a part of the anode Anode. The emission layer EML is positioned on the anode Anode exposed by the opening OP. The emission layer EML may be positioned only within the opening of the black pixel definition layer 380, and is spaced apart from adjacent emission layers EML by the black pixel definition layer 380.

The black pixel definition layer 380 may be formed of an organic material having a negative kind of a black color. The organic material having a black color may include the light blocking material, and the light blocking material may include a resin or a paste including carbon black, carbon nanotubes, and/or a black dye, metal particles, for example, such as nickel, aluminum, molybdenum, and/or suitable alloys thereof, metal oxide particles (e.g., chromium nitride), and/or the like. The black pixel definition layer 380 may have the black color including the light blocking material, and may have a characteristic such that light is not reflected and is absorbed/blocked instead. Because the negative kind uses the organic material, it may have a characteristic such that a portion covered by a mask is removed.

The spacer 385 is formed on the pixel definition layer 380. The spacer 385 includes a first portion 385-1 having a relatively higher height and positioned in a relatively narrower area, and a second portion 385-2 having a relatively lower height and positioned in a relatively wider area. For convenience, FIG. 6 shows that the first portion 385-1 and the second portion 385-2 are separated (e.g., separate parts from each other) through a dotted line (e.g., a virtual dotted line) in the spacer 385. Here, the first portion 385-1 may provide a role of securing a rigidity against a pressing pressure by strengthening a scratch strength. The second portion 385-2 may serve as a contact assistant between the black pixel definition layer 380 and the overlying functional layer FL. The first portion 385-1 and the second portion 385-2 may be formed of the same material as each other, and may be formed of a positive kind of a photosensitive organic material, for example, such as a photosensitive polyimide (PSPI). Because the spacer 385 has a positive characteristic, a portion not covered by the mask may be removed. The spacer 385 may be transparent so that light may be transmitted and/or reflected.

Here, the pixel definition layer 380 may be formed as the negative kind, and the spacer 385 may be formed as a positive kind, and they may include materials of the same kind as each other.

At least one part (e.g., at least a portion) of the upper surface of the pixel definition layer 380 is covered by the spacer 385, and the edge of the second portion 385-2 has a structure that may be spaced apart from the edge of the pixel definition layer 380, such that a part (e.g., a portion) of the pixel definition layer 380 has a structure that is not covered by the spacer 385. The second portion 385-2 reinforces the adhesion characteristic between the pixel definition layer 380 and the functional layer FL, by covering even the upper surface of the black pixel definition layer 380 where the first portion 385-1 is not positioned. In the present embodiment, the spacer 385 is positioned only in an area that overlaps with the light blocking layer 220 on a plane to be described in more detail below, and when viewed from the front of the display panel DP (e.g., in a plan view), the spacer 385 may not be visible due to being covered by (e.g., overlapping with) the light blocking layer 220.

The functional layer FL is positioned on the spacer 385 and the exposed pixel definition layer 380, and the functional layer FL may be formed on the entire surface of the light emitting display panel DP or may be formed on all areas except for a partial area, for example, such as the light transmissive area of the second component area EA2. The functional layer FL may include an electron injection layer, an electron transport layer, a hole transport layer, and/or a hole injection layer, and the functional layer FL may be positioned above/under the emission layer EML. In other words, the hole injection layer, the hole transport layer, the emission layer EML, the electron transport layer, the electron injection layer, and the cathode Cathode may be sequentially positioned on the anode Anode. As such, the hole injection layer and the hole transport layer from among the functional layer FL may be positioned under the emission layer EML, and the electron transport layer and the electron injection layer may be positioned above the emission layer EML.

According to an embodiment, the spacer 385 may reduce an occurrence rate of defects due to (e.g., that may be caused by) a pressing pressure by increasing the scratch strength of the light emitting display device DP, and may also increase adherence with the functional layer FL positioned on the spacer 385, thereby preventing or substantially preventing moisture and air from permeating from the outside. In addition, the high adherence may eliminate or reduce adherence problems between layers when the light emitting display device DP has a flexible characteristic such that it is repeatedly folded and unfolded.

The cathode Cathode may be formed of a light-transmitting electrode or a reflecting electrode. According to an embodiment, the cathode may be a transparent or semi-transparent electrode, and may be formed of a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), and/or a suitable compound thereof. In addition, a transparent conductive oxide (TCO), such as Indium Tin Oxide (ITO), Indium Zinc Oxide (IZO), zinc oxide (ZnO), or indium oxide ($In_2O_3$), may be further disposed on the metal thin film. The cathode Cathode may be integrally formed over the entire surface of the light emitting display device DP.

The encapsulation layer 400 is positioned on the cathode Cathode. The encapsulation layer 400 includes at least one inorganic layer and at least one organic layer. For convenience, FIG. 6 illustrates that the encapsulation layer 400 has a triple layered structure including a first inorganic encapsulation layer 401, an organic encapsulation layer 402, and a second inorganic encapsulation layer 403. The encapsulation layer 400 may protect the emission layer EML formed of the organic material from moisture and/or oxygen that may be inflowed from the outside. According to an embodiment, the encapsulation layer 400 may include a structure in which an inorganic layer and an organic layer are sequentially further stacked.

Detecting insulating layers 501, 510, and 511 and a plurality of detecting electrodes 540 and 541 are positioned on the encapsulation layer 400 for touch sensing. In an embodiment, as illustrated in FIG. 6, a touch is sensed in a capacitive type using two detecting electrodes 540 and 541. According to another embodiment, the touch may be sensed in a self-cap type using one detecting electrode. A plurality of detecting electrodes 540 and 541 may be insulated from each other via the second detecting insulating layer 510 therebetween. For example, the lower detecting electrode 541 may be positioned on the first detecting insulating layer 501, the upper detecting electrode 540 may be positioned on the second detecting insulating layer 510, and the upper detecting electrode 540 may be covered by the third detecting insulating layer 511. The plurality of detecting electrodes 540 and 541 may be electrically connected to one another through an opening positioned in (e.g., penetrating) the second detecting insulating layer 510. The detecting electrodes 540 and 541 may include a suitable metal or a suitable metal alloy, such as aluminum (Al), copper (Cu), silver (Ag), gold (Au), molybdenum (Mo), titanium (Ti), or tantalum (Ta), and may be composed of a single layer or multiple layers.

The light blocking layer 220 and the color filters 230R, 230G, and 230B are positioned on the third detecting insulating layer 511.

The light blocking layer 220 may be positioned to overlap with the detecting electrode 540 and 541 on a plane (e.g., in a plan view), and to not overlap with the anode Anode on a plane (e.g., in a plan view). As such, the anode Anode and the emission layer EML capable of displaying images may be prevented or substantially prevented from being covered by the light blocking layer 220 and the detecting electrodes 540 and 541.

As shown in FIG. 6, the light blocking layer 220 may be positioned in the area overlapping with the pixel definition layer 380 on a plane (e.g., in a plan view), and one side of the light blocking layer 220 may be disposed to be more inward from a corresponding side of the pixel definition layer 380 (e.g., in a plan view).

The light blocking layer 220 also has an opening OPBM, and the area of the opening OPBM of the light blocking layer 220 may be formed to be larger than the opening OP of the pixel definition layer 380. The opening OP of the pixel definition layer 380 on a plane (e.g., in a plan view) may be positioned within the opening OPBM of the light blocking layer 220.

In addition, one side of the spacer 385 is also disposed more inward from the corresponding side of the pixel definition layer 380 by a suitable interval (e.g., a certain or predetermined interval) g−1, and the spacer 385 is also disposed more inward from the one side of the light blocking layer 220 (e.g., in a plan view). As a result, when viewed from the front of the display panel DP (e.g., in a plan view), the spacer 385 may not be visible due to being covered by the light blocking layer 220.

When external light is incident, it may pass through the opening OPBM of the light blocking layer 220, and may then be reflected from a side wall of the opening OP of the pixel definition layer 380. The side wall of the opening OP of the pixel definition layer 380 forms a curved surface, and color separation may occur depending on the reflected positions, so that the colors of the reflected light may be seen in various colors like a rainbow. Because this color-separated reflected light may be easily visible to the eyes of the user, display quality may be deteriorated. In an embodiment, such as the embodiment illustrated in FIG. 7, the opening OP of the pixel definition layer 380 may be formed in a circular shape, and the opening OPBM of the light blocking layer 220 may be formed in an elliptical shape, so that the degree of the diffraction of the light reflected from the side wall of the opening OP of the pixel definition layer 380 may be alleviated, and the spread of the diffraction may also be improved. As such, the degradation of the display quality due to the reflected light may be reduced. This is described in more detail below with reference to FIG. 7.

The color filters 230R, 230G, and 230B are positioned on the detecting insulating layers 501, 510, and 511 and the light blocking layer 220. The color filters 230R, 230G, and 230B include a red color filter 230R that transmits red light, a green color filter 230G that transmits green light, and a blue color filter 230B that transmits blue light. Each of the color filters 230R, 230G, and 230B may be positioned to overlap with a corresponding anode Anode of a corresponding light emitting diode (LED) on a plane (e.g., in a plan view). Because light emitted from the emission layer EL may be emitted while being changed to a corresponding color through the color filter, all of the light emitted from the emission layer EL may have the same color. In other words, in some embodiments, all of the emission layers EL may emit the same or substantially the same colored light. However, in the emission layers EL of the present embodiment, different colors of light are displayed, and the displayed colors may be enhanced by passing through the color filters of the same corresponding color.

The light blocking layer 220 may be positioned between the color filters 230R, 230G, and 230B. According to an embodiment, the color filters 230R, 230G, and 230B may be replaced with a color conversion layer, or may further include a color conversion layer. The color conversion layer may include quantum dots.

A planarization layer 550 covering the color filters 230R, 230G, and 230B is positioned on the color filters 230R, 230G, and 230B. The planarization layer 550 is for planarizing or substantially planarizing the upper surface of the light emitting display panel, and may be a transparent organic insulator containing at least one material selected from a group consisting of polyimide, polyamide, acryl resin, benzocyclobutene, and phenol resin.

According to an embodiment, on top of the planarization layer 550, a low refractive layer and an additional planarization layer may be further positioned to improve front visibility and light output efficiency of the display panel. Light may be emitted while being refracted to the front by the low refractive layer and the additional planarization layer having a high refractive characteristic. In this case, the low refractive layer and the additional planarization layer may be positioned directly on the color filter 230, while the planarization layer 550 is omitted according to some embodiments.

In the present embodiment, a polarizer is not included on the planarization layer 550. Typically, a polarizer may serve to prevent display deterioration in which the user recognizes that external light is incident and reflected from the anode Anode or the side wall of the opening OP of the pixel definition layer 380 and/or the like. However, the polarizer may not only reduce the reflection of the external light, but may also reduce the light emitted from the emission layer EML, so that more power may be consumed to display a desired luminance (e.g., a certain or predetermined luminance). According to the present embodiment, the polarizer may not be included in the light emitting display device, and thus, power consumption may be reduced.

Further, in the present embodiment, the pixel definition layer 380 covers the side of the anode Anode to reduce a degree of reflection from the anode Anode, and the light blocking layer 220 is also formed to reduce an incidence of light. As such, a structure for preventing or reducing the deterioration of the display quality due to the reflection may already be provided. Therefore, there may be no need to separately form the polarizer on the front of the light emitting display panel DP.

Figure 7:
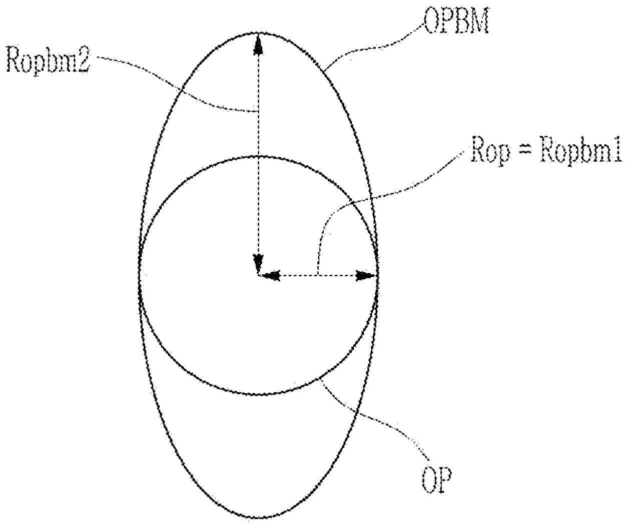
FIG. 7 and FIG. 8 are top plan views of a portion of a display panel according to an embodiment.
Figure 8:
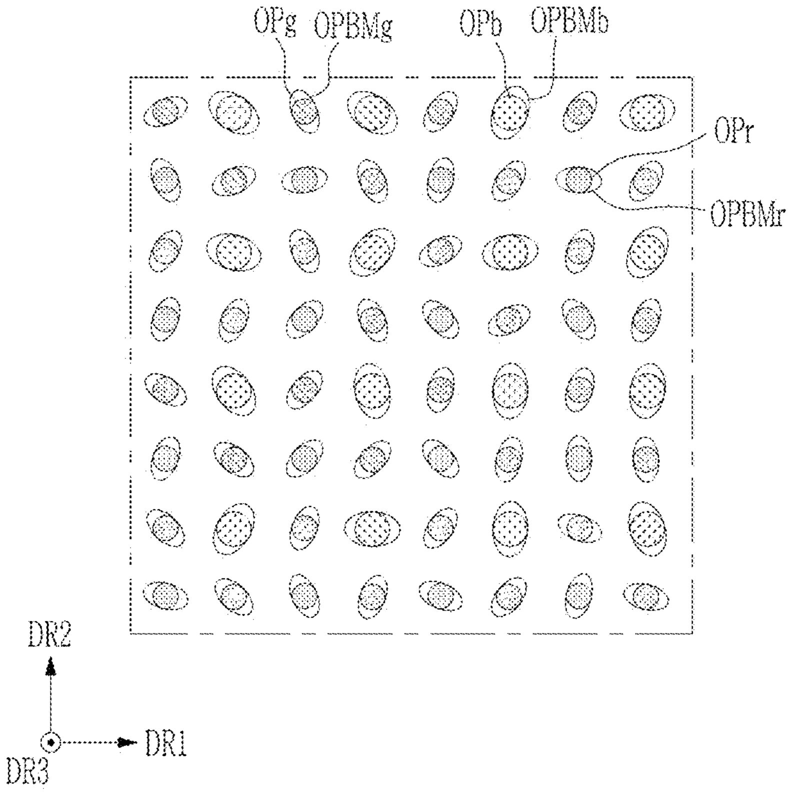

Hereinafter, an embodiment of the opening OPBM of the light blocking layer 220 formed in an elliptical shape through the structure of the light emitting display panel DP formed in the display area DA is described in more detail with reference to FIG. 7 and FIG. 8. In FIGS. 7 and 8, the opening OP of the pixel definition layer 380 is shown as being formed in a circular shape.

FIG. 7 and FIG. 8 are top plan views of a portion of a display panel according to an embodiment.

In FIG. 7, one opening OP of the pixel definition layer 380 and one opening OPBM of the light blocking layer 220 corresponding thereto are shown. In FIG. 7, the pixel definition layer 380 is positioned on the outer part of the opening OP, and the light blocking layer 220 is positioned on the outer part of the opening OPBM.

In the embodiment of FIG. 7, the opening OP of the pixel definition layer 380 has a circular planar shape, and the opening OPBM of the light blocking layer 220 has an elliptical planar shape. In a plan view, the opening OPBM of the elliptical light blocking layer 220 has a structure in contact with the opening OP of the circular pixel definition layer 380 at two points. In the embodiment of FIG. 7, a radius value Rop of the circular shape of the opening OP of the pixel definition layer 380 is equal to or substantially equal to a half value Ropbm1 of a short axis length of the elliptical shape of the opening OPBM of the light blocking layer 220, and is smaller than a half value Ropbm2 of the long axis length of the elliptical shape of the opening OPBM. The half value Ropbm2 of the elliptical long axis length may be larger than the radius value Rop of the circular opening OP of the pixel definition layer 380 by 4.5 μm or more and 10 μm or less. In the long axis length of the elliptical shape, the horizontal interval may be changed according to a thickness of the layer (e.g., the encapsulation layer) positioned between the light blocking layer 220 and the pixel definition layer 380 on a cross-section, and the encapsulation layer may have a thickness of about 6 μm.

The ellipse has two focal points, may have a shape in which the sum of the distances to two focal points is constant or substantially constant, and may have the long axis and the short axis. On the other hand, eccentricity of the ellipse is a value obtained by dividing the distance between two foci by the length of the long axis. If the eccentricity is 0, the shape is a circle, and if the eccentricity is 1, the shape forms a parabola, so the ellipse has the eccentricity value that is greater than 0 and less than 1. The eccentricity value of the ellipse, which is the shape of the opening OPBM of the light blocking layer 220, may be variously modified as needed or desired. The direction of the long axis of the opening OPBM of the light blocking layer 220 may also be variously modified as needed or desired. The eccentricity and the long axis direction are described in more detail below with reference to FIG. 18 to FIG. 21.

In the embodiment of FIG. 7, the opening OP of the pixel definition layer 380 and the opening OPBM of the light blocking layer 220 are in contact with each other at two points on a plane (e.g., in a plan view), but due to an error that may occur during actual processing, a part of one side of the opening OP of the pixel definition layer 380 may be covered with the light blocking layer 220 without overlapping with the opening OPBM of the light blocking layer 220. In this case, an effect similar to that described in more detail below with reference to FIG. 13 may occur.

The opening OP of the pixel definition layer 380 and the opening OPBM of the light blocking layer 220 having the structure illustrated in FIG. 7 may be variously disposed as shown in FIG. 8. In FIG. 8, the openings OP of the pixel definition layer 380 and the openings OPBM of the light blocking layer 220, corresponding to each of the emission layers based on the emission layers displaying three primary colors of red, green, and blue, are divided and shown as openings OPr, OPg, and OPb and openings OPBMr, OPBMg, and OPBMb, respectively. Here, r, g, and b may correspond to red, green, and blue, respectively.

The openings OPBMr, OPBMg, and OPBMb of the light blocking layer 220 may be disposed at various suitable angles, and the red opening OPBMr, the green opening OPBMg, and the blue opening OPBMb of the light blocking layer 220 may have different eccentricities. The openings OPBMr, OPBMg, and OPBMb of the same color as each other may be formed with the same eccentricity as each other. For example, referring to FIG. 21, the eccentricity of the elliptical shape may have a range of 0.2 or more and 0.85 or less.

In this case, the red opening OPr, the green opening OPg, and the blue opening OPb of the pixel definition layer 380 may be formed as circles having different radii from each other, and the openings OPr, OPg, and OPb of the same color as each other may have the same size with the same radius as each other.

One of the openings OPr, OPg, and OPb of the pixel definition layer 380 correspond to one of the openings OPBMr, OPBMg, and OPBMb of the light blocking layer 220. In other words, within each of the openings OPBMr, OPBMg, and OPBMb of the light blocking layer 220, a corresponding one of the openings OPr, OPg, and OPb of the pixel definition layer 380 is positioned. The openings OPBMr, OPBMg, and OPBMb of the light blocking layer 220 and the openings OPr, OPg, and OPb of the pixel definition layer 380 respectively corresponding to each other may overlap with each other on a plane (e.g., in a plan view).

In the embodiment of FIG. 7 and FIG. 8, the circular openings OPr, OPg, and OPb of the pixel definition layer 380, and the elliptical openings OPBMr, OPBMg, and OPBMb of the light blocking layer 220 have a structure in which they are in contact with one another at two points on a plane (e.g., in a plan view). However, according to an embodiment, the openings OPBMr, OPBMg, and OPBMb of the light blocking layer 220 may be larger, so that a structure (e.g., referring to FIG. 11) in which the circular openings OPr, OPg, and OPb of the pixel definition layer 380 are positioned within the openings OPBMr, OPBMg, and OPBMb of the light blocking layer 220 on a plane (e.g., in a plan view) may be formed. In another embodiments, the blocking openings OPBMr, OPBMg, and OPBMb of the light blocking layer 220 may be smaller, so that a structure (e.g., referring to FIG. 13) in which some of the circular openings OPr, OPg, and OPb of the pixel definition layer 380 are covered by the flat light blocking layer 220 may be formed.

Figure 19:
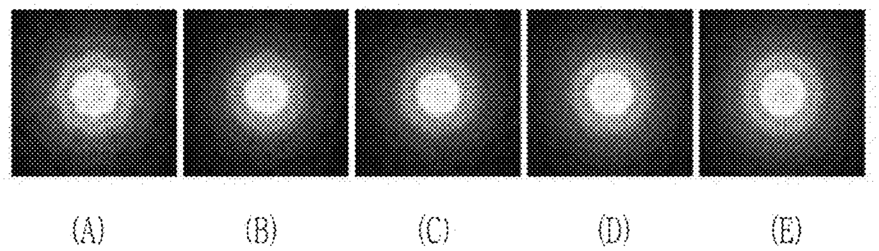
FIG. 19 is a photograph of a reflection characteristic according to an angle.

Referring to FIG. 8, the openings OPBMr, OPBMg, and OPBMb of the light blocking layer 220 may be arranged in various suitable directions, and an angle at which the openings OPBMr, OPBMg, and OPBMb are arranged may be defined based on the long axis direction of the ellipse. According to an embodiment, as shown in FIG. 19 described in more detail below, the angle formed by each long axis of the blocking openings OPBMr, OPBMg, and OPBMb of the light blocking layer 220 may have an angle of five angles or more, and the angle formed by the long axis may be disposed with an interval of an angle of 36 degrees or less.

As an example, a angular relationship centering on an embodiment having five angles is described in more detail as follows. In the embodiment having five angles, the angles of the long axis are formed with the interval of 36 degrees, and when one long axis has 0 degrees based on the first direction DR1, the angles are 36 degrees, 72 degrees, 108 degrees, and 144 degrees, thereby, totaling the five angles. In other words, when the angle of 180 degrees is divided by 5, which is the number of directions, and the five angles may be checked with the interval between the angles of the long axis, this may mean that two angles having the angle of 180 degrees from among 360 degrees are the same or substantially the same for the long axis direction of the ellipse, so that the angles are obtained by dividing 180 degrees by the number of directions.

As described above, a plurality of openings OPBMr, OPBMg, and OPBMb of the light blocking layer 220 may be disposed with the interval at the specific angle that the angle formed by long axes is 36 degrees or less. However, according to an embodiment, the angle formed by the long axis of each opening OPBMr, OPBMg, and OPBMb may be disposed at an irregular interval with one angle of 36 degrees or less. An embodiment in which the long axis of the opening is disposed with the non-equal interval may be intentionally disposed to reduce a diffraction pattern, or may be arranged with the non-equal interval due to a processing error.

In order for a unit pixel including the openings of red, green, and blue to have a square structure, the angle of the long axis may be appropriately formed by being divided into the number corresponding to the square of an integer, for example, such as 22, 32, 42, 52, and the like. Here, the unit pixel may include one by one of the red, green, and blue openings, and the opening of one color from among them, for example, such as the green opening, may be formed in a plurality.

The reflection characteristics when the openings OPr, OPg, and OPb of the pixel definition layer 380 are formed in a circular shape, and the openings OPBMr, OPBMg, and OPBMb of the light blocking layer 220 are formed in an elliptical shape are described in more detail below with reference to FIG. 9.

Figure 9:
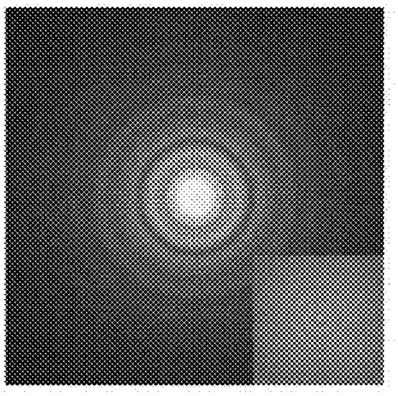
FIG. 9 is a photograph of reflection characteristics for a comparative example and an embodiment.
Figure 9:
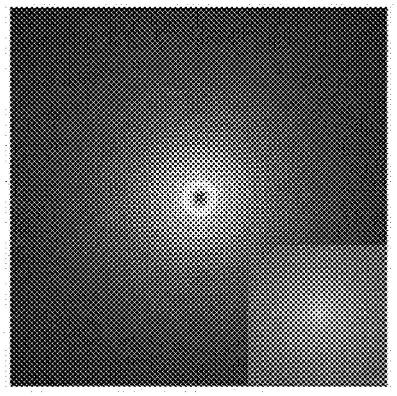

FIG. 9 is a photograph of reflection characteristics for a comparative example and an embodiment.

In FIG. 9, (A) shows a diffraction pattern and color dispersion of a reflected light for the comparative example, and (B) shows a diffraction pattern and color dispersion of a reflected light according to the embodiment illustrated in FIG. 8. Here, the comparative example has a structure in which both the openings OPr, OPg, and OPb of the pixel definition layer 380 and the openings OPBMr, OPBMg, and OPBMb of the light blocking layer 220 are formed in a circular shape.

First, referring to the comparative example (A) of FIG. 9, the diffraction pattern is formed in a shape of a plurality of rings, such that each ring shape may be clearly identified, and each ring represents a different color, so that the user may easily see that the reflected light is color-separated.

In comparison, referring to the example (B) of FIG. 9, it may be confirmed that the diffraction pattern is relatively unclear, and the shape of the ring is not clear. The diffraction patterns are unclear as described above may occur due to following reasons.

First, when the openings OPr, OPg, and OPb of the pixel definition layer 380 are formed in the circular shape, and the openings OPBMr, OPBMg, and OPBMb of the light blocking layer 220 are formed in the elliptical shape, because the interval between two openings is not constant, the diffraction patterns may occur while light emitted from the emission layer positioned within the openings OPr, OPg, and OPb of the pixel definition layer 380 is bent at the side wall of the openings OPBMr, OPBMg, and OPBMb of the light blocking layer 220 and may be different from each other. Therefore, when the diffraction patterns are mixed, the diffraction patterns may be blurred while constructive interference occurs less. Therefore, according to the openings OPBMr, OPBMg, and OPBMb of the elliptical light blocking layer 220, the diffraction pattern may spread and may not become clear. Also, referring to FIG. 8, because the elliptical openings OPBMr, OPBMg, and OPBMb of the light blocking layer 220 are arranged at various angles, the directions of the diffraction patterns are also varied, so that they are mixed with each other and blurred with each other, resulting in a scattering effect. Due to the mixing of the diffraction patterns, the diffraction pattern is not clear and it may be difficult for the user to easily view the diffraction pattern, thereby, reducing the degree of display quality deterioration.

According to an embodiment, the angles at which the long axes of the openings OPBMr, OPBMg, and OPBMb of the light blocking layer 220 of the ellipse are arranged may be five or more or may be disposed with the interval of the angles of 36 degrees or less. In this case, the further deteriorated diffraction pattern and color separation may occur. This is described in more detail below with reference to FIG. 18 and FIG. 19.

Hereinafter, two arrangements having a specific angular interval formed by the long axes of the elliptical openings OPBMr, OPBMg, and OPBMb of the light blocking layer 220 according to an embodiment like that of FIG. 7 are examined with reference to FIG. 10.

Figure 10:
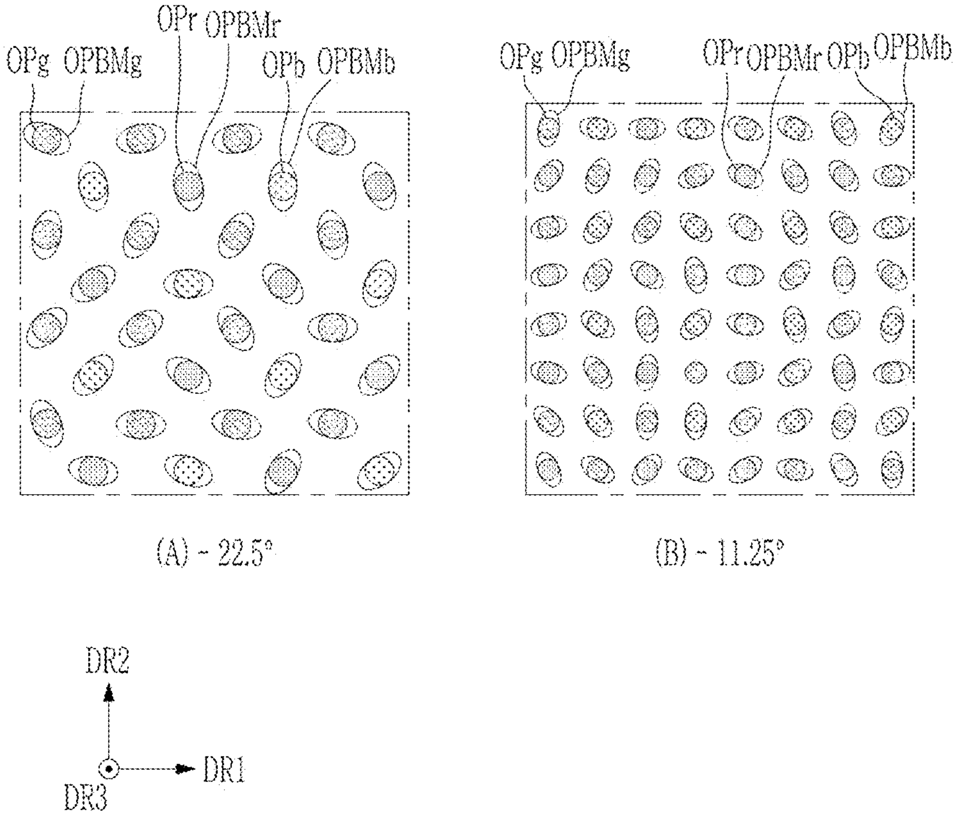
FIG. 10 is a top plan view of a portion of display panels having various angle arrangements according to one or more embodiments.

FIG. 10 is a top plan view of a portion of display panels having various angle arrangements according to one or more embodiments.

In FIG. 10, the example (A) illustrates an embodiment in which the long axes of the openings OPBMr, OPBMg, and OPBMb of the light blocking layer 220 having an elliptical shape are arranged at an angular interval of 22.5 degrees. In FIG. 10, the example (B) illustrates an embodiment in which the long axes of the openings OPBMr, OPBMg, and OPBMb of the light blocking layer 220 are arranged at half the angular interval of that of the example (A), or in other words, at an angular interval of 11.25 degrees.

In the embodiment of the example (A) having the angular interval of 22.5 degrees, the number of angles formed by the long axes of the openings OPBMr, OPBMg, and OPBMb of the light blocking layer 220 having the elliptical shape may be eight. In other words, because the value obtained by dividing 180 degrees by 8 is 22.5 degrees, the long axes of the openings OPBMr, OPBMg, and OPBMb of the light blocking layer 220 may be arranged in eight directions. Here, the reason for calculating based on 180 degrees instead of 380 degrees is that two angles having a difference of 180 degrees are in the same or substantially the same direction as each other.

In comparison, the embodiment of the example (B) having the angular interval of 11.25 degrees has twice as many angles as that of the embodiment of the example (A), so that the long axes of the openings OPBMr, OPBMg, and OPBMb of the light blocking layer 220 are arranged in a total of 16 directions.

In the two embodiments of the angular arrangements shown in FIG. 10, as the arrangement angle of the long axis of the opening OPBMr, OPBMg, and OPBMb of the light blocking layer 220 has the number greater than 5, and thus, the diffraction pattern is mixed without a specific directionality, the user may not easily recognize the directionality or the color separation of the diffraction pattern, so that the display quality may be improved.

In FIG. 10, the long axis directions of the plurality of openings OPBMr, OPBMg, and OPBMb of the light blocking layer 220 are illustrated as being arranged with equal or substantially equal intervals, but the present disclosure is not limited thereto, and they may be arranged with non-equal intervals at an angle of 36 degrees or less according to an embodiment.

As described above with reference to FIG. 7, one or more embodiments having the structure in which the opening OP of the pixel definition layer 380 is formed in the circular shape, the opening OPBM of the light blocking layer 220 is formed in the elliptical shape, and the circular shape and the ellipse are in contact with each other on a plane (e.g., in a plan view) has been examined.

However, as described in more detail hereinafter with reference to FIG. 11 to FIG. 17, one of the opening OP of the pixel definition layer 380 or the opening OPBM of the light blocking layer 220 may be relatively larger (e.g., may be increased).

First, one or more embodiments in which the opening OP of the pixel definition layer 380 is positioned within the opening OPBM of the light blocking layer 220 (e.g., in a plan view), so that the opening OP of the pixel definition layer 380 is not covered by the light blocking layer 220, is described in more detail with reference to FIG. 11 and FIG. 12.

Figure 11:
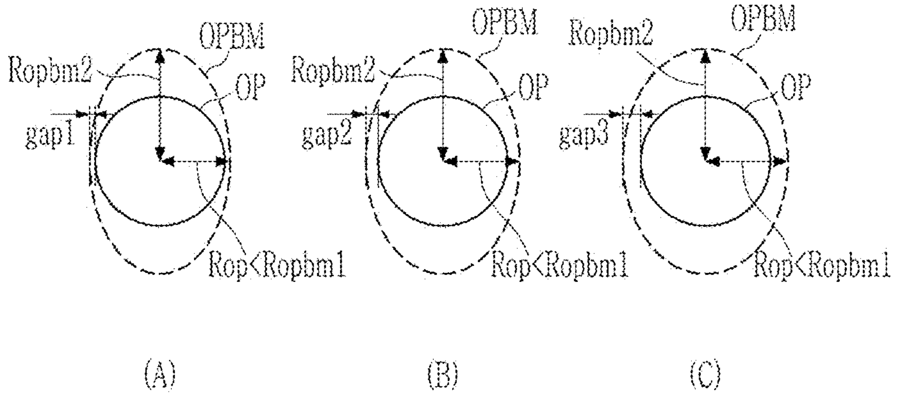
FIG. 11 and FIG. 12 are top plan views of a portion of a display panel according to an embodiment.
Figure 12:
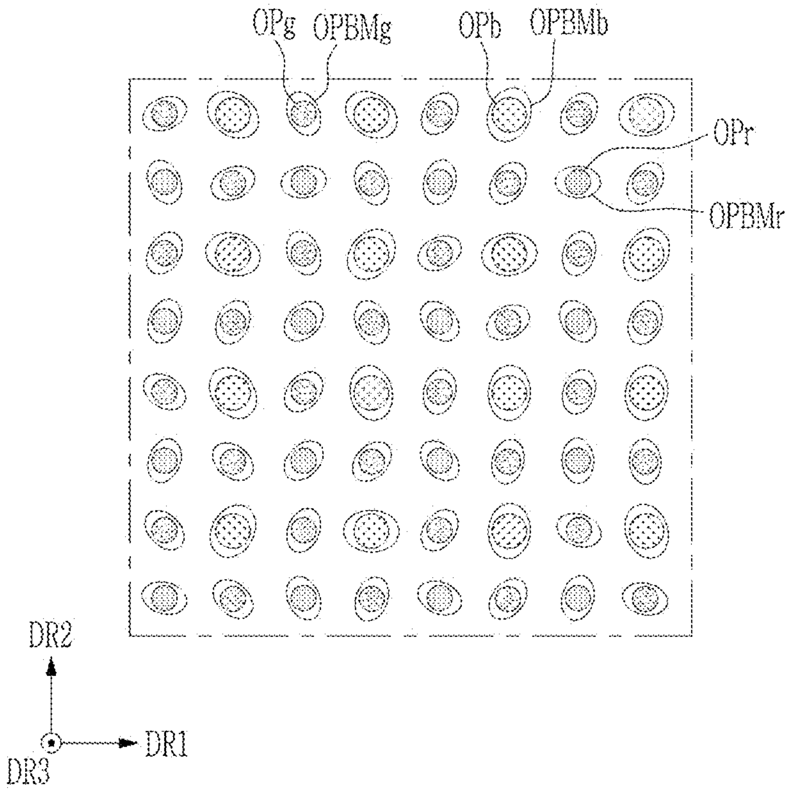

FIG. 11 and FIG. 12 are top plan views of a portion of a display panel according to an embodiment.

FIG. 11 shows that various intervals gap1, gap2, and gap3 may be formed depending on how much the opening OPBM of the light blocking layer 220 is larger than the opening OP of the pixel definition layer 380.

In FIG. 11, because the opening OPBM of the light blocking layer 220 is relatively larger, the circular opening OP of the pixel definition layer 380 is positioned within the opening OPBM of the light blocking layer 220 on a plane (e.g., in a plan view). Therefore, a radius value Rop of the circular shape of the opening OP of the pixel definition layer 380 is smaller than the half value Ropbm1 of the short axis length of the elliptical shape of the opening OPBM of light blocking layer 220, and smaller than the half value Ropbm2 of the long axis length of the elliptical shape. The half value Ropbm2 of the elliptical long axis length may be larger than the radius value Rop of the circular opening OP of the pixel definition layer 380 by 4.5 μm or more and 10 μm or less.

In more detail, in the example (A) of FIG. 11, a minimum horizontal interval gap1 in a plan view between the opening OPBM of the light blocking layer 220 and the opening OP of the pixel definition layer 380 is not relatively as large as those of the other examples. In the example (B) of FIG. 11, the minimum horizontal spacing gap2 is relatively larger than gap1, and in the example (C) of FIG. 11, the minimum horizontal interval gap3 is the largest. In the examples (A) to (C) of FIG. 11, the eccentricity of the elliptical shape of the openings OPBM of the light blocking layer 220 may also be different from each other. For example, the eccentricity of the elliptical shape may have a range of 0.2 or more and 0.85 or less (e.g., referring to FIG. 21).

However, in the embodiments illustrated in FIG. 11, due to an error during actual processing, a part of one side of the opening OP of the pixel definition layer 380 may be covered by the light blocking layer 220 without overlapping with the opening OPBM of the light blocking layer 220. In addition, although the opening OP of the pixel definition layer 380 is illustrated as being positioned within the opening OPBM of the light blocking layer 220, the opening OP may be positioned closer on one boundary or in contact with one boundary of the opening OPBM on a plane (e.g., in a plan view).

FIG. 12 shows an embodiment in which the elliptical long axes of the openings OPBMr, OPBMg, and OPBMb of the light blocking layer 220 are arranged at various angles. The openings OPBMr, OPBMg, and OPBMb of the light blocking layer 220 of FIG. 12 may have different eccentricity for each color. According to an embodiment, two openings corresponding to the same color from among the openings OPBMr, OPBMg, and OPBMb of the light blocking layer 220 may have different eccentricities from each other. According to an embodiment, all openings OPBMr, OPBMg, and OPBMb of the light blocking layer 220 may have the same eccentricity as each other. In addition, the angle at which the long axes of the elliptical openings OPBMr, OPBMg, and OPBMb of the light blocking layer 220 are arranged may have 5 or more angles, or may be disposed with the interval of 36 degrees or less.

In the embodiments of FIG. 11, eight long axis directions may be arranged with the angular interval of 22.5 degrees as shown in the example (A) of FIG. 10, or as shown in the example (B) of FIG. 10, 16 long axis directions may be arranged with the angular interval of 11.25 degrees.

In FIG. 12, the long axis directions of a plurality of openings OPBMr, OPBMg, and OPBMb of the light blocking layer 220 are arranged with an equal or substantially equal interval, but according to the embodiments of FIG. 11, a non-equal interval may also be formed with the angle of 36 degrees or less according to an embodiment.

Hereinafter, a structure in which the opening OPBM of the light blocking layer 220 is relatively smaller, and a part of the opening OP of the circular pixel definition layer 380 is covered by the light blocking layer 220 on a plane (e.g., in a plan view) is described in more detail with reference to FIG. 13 to FIG. 17.

First, a basic relation of the opening OPBM of the light blocking layer 220 and the opening OP of the pixel definition layer 380 is described in more detail with reference to FIG. 13 and FIG. 14.

Figure 13:
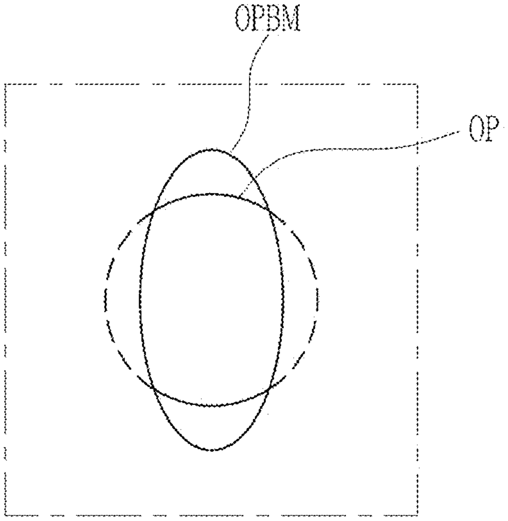
FIG. 13 and FIG. 14 are top plan views of a portion of a display panel according to an embodiment.
Figure 14:
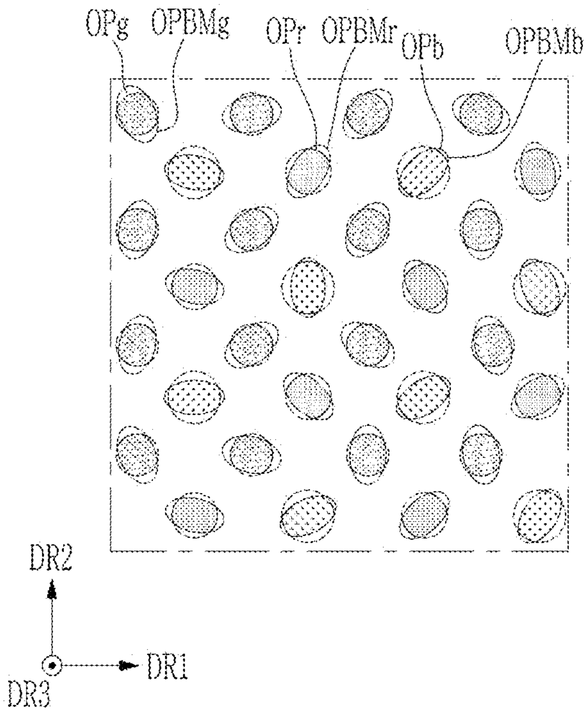

FIG. 13 and FIG. 14 are top plan views of a portion of a display panel according to an embodiment.

FIG. 13 shows one opening OP of the pixel definition layer 380 and one opening OPBM of the light blocking layer 220. The opening OPBM of the light blocking layer 220 overlaps with a portion of the opening OP of the pixel definition layer 380, and the light blocking layer 220 covers remaining portions of the opening OP. As a result, the emission layer positioned within the opening OP of the pixel definition layer 380 may be partially covered by the light blocking layer 220 (e.g., in a plan view). Therefore, a narrow area of the opening OP of the pixel definition layer 380 may be covered by the light blocking layer 220. In FIG. 13, a part of the opening OP of the pixel definition layer 380 is shown as a dotted line to illustrate that the corresponding part is positioned (e.g., indirectly positioned) below (e.g., underneath) the light blocking layer 220 and covered by the light blocking layer 220 (e.g., in a plan view).

However, referring to embodiment of FIG. 13, due to an error during an actual processing, the portion covered by the light blocking layer 220 from among the opening OP of the pixel definition layer 380 may not be constant on both sides, and the area on one side may be relatively larger. In addition, one side of the opening OP of the pixel definition layer 380 may be positioned within or in contact with the opening OPBM of the light blocking layer 220 (e.g., in a plan view), and only the other side may be covered by the light blocking layer 220.

As shown in FIG. 13, if a part of the opening OP of the pixel definition layer 380 is covered by the light blocking layer 220, light emitted from the emission layer within the opening OP may not be provided to the front, which may reduce light efficiency. However, because the size of the opening OP of the pixel definition layer 380 is related to a lifetime of the emission layer positioned therein, the size of the opening OP may not be reduced in order to maintain or substantially maintain the lifetime beyond a desired level (e.g., a certain or predetermined level).

The opening OP of the pixel definition layer 380 and the opening OPBM of the light blocking layer 220 of the structure shown in FIG. 13 may be variously arranged like that illustrated in FIG. 14.

Referring to FIG. 14, the long axes of the elliptical opening OPBMr, OPBMg, and OPBMb of the light blocking layer 220 are arranged at various suitable angles. Here, the openings OPr, OPg, and OPb of the pixel definition layer 380 are each formed in a circular shape, some of the openings OPr, OPg, and OPb are overlapped with the openings OPBMr, OPBMg, and OPBMb of the light blocking layer 220 and are not covered by the light blocking layer 220, and the rest of the openings OPr, OPg, and OPb of the pixel definition layer 380 does not overlap with the openings OPBMr, OPBMg, and OPBMb of the light blocking layer 220 and is covered by the light blocking layer 220.

Also, the opening OPBMr, OPBMg, and OPBMb of the light blocking layer 220 of FIG. 14 have different eccentricity for each color. According to an embodiment, two openings corresponding to the same color from among the openings OPBMr, OPBMg, and OPBMb of the light blocking layer 220 may have different eccentricities from each other. According to an embodiment, all of the openings OPBMr, OPBMg, and OPBMb of light blocking layers 220 may have the same or substantially the same eccentricity. Here, the eccentricity of the elliptical shape, referring to FIG. 21, may have a range of 0.2 or more and 0.85 or less. In addition, the angle at which the long axes of the elliptical openings OPBMr, OPBMg, and OPBMb of the light blocking layer 220 are arranged may have 5 or more angles, or may be disposed with the interval of 36 degrees or less.

In the embodiment of FIG. 13, eight long axis directions may be arranged with the angular interval of 22.5 degrees as shown in the example (A) of FIG. 10 (A), or as shown in the example (B) of FIG. 10, 16 long axis directions may be arranged with the angular interval of 11.25 degrees.

In FIG. 14, the long axis directions of a plurality of openings OPBMr, OPBMg, and OPBMb of the light blocking layer 220 are arranged with equal or substantially equal intervals, but in the embodiment of FIG. 13, a non-equal interval may also be formed with the angle of 36 degrees or less according to an embodiment.

As described above, in embodiments in which some of the openings OPr, OPg, and OPb of the pixel definition layer 380 are covered by the light blocking layer 220, a diffraction characteristic of reflected external light thereof is described in more detail below with reference to FIG. 15.

Figure 15:
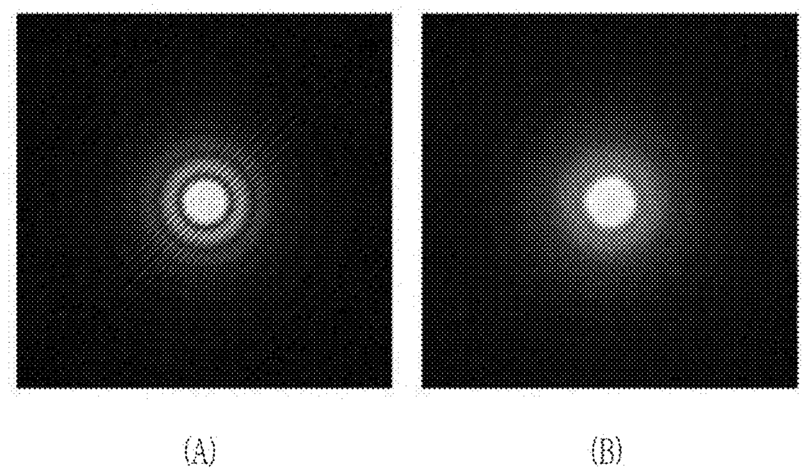
FIG. 15 is a photograph of reflection characteristics for a comparative example and an embodiment.

FIG. 15 is a photograph of reflection characteristics for a comparative example and an embodiment.

In FIG. 15, the example (A) is a diffraction pattern of a comparative example, like that of the example (A) in FIG. 9 described above, and shows the diffraction pattern of the structure in which all of the openings OPr, OPg, and OPb of the pixel definition layer 380 and the openings OPBMr, OPBMg, and OPBMb of the light blocking layer 220 are formed of a circular shape.

In FIG. 15, the example (B) shows the diffraction pattern and the color dispersion of the reflected light for the embodiment illustrated in FIG. 14.

Comparing the example (B) with the comparative example (A) of FIG. 15, it may be confirmed that the diffraction pattern of the example (B) is relatively not clear, and the shape of the ring is not clearly visible. In FIG. 13 and FIG. 14, some of the openings OPr, OPg, and OPb of the pixel definition layer 380 are covered by the light blocking layer 220, however, it may be confirmed that there is no significant difference in the diffraction pattern from embodiments in which the openings OPr, OPg, and OPb of the pixel definition layer 380 are in contact with the openings OPBMr, OPBMg, and OPBMb of the light blocking layer 220 (e.g., in a plan view) like that of FIG. 7, or all of the openings OPBMr, OPBMg, and OPBMb of the pixel definition layer 380 are positioned within the openings OPBMr, OPBMg, and OPBMb of the light blocking layer 220 (e.g., in a plan view) like that of FIG. 11. In other words, even in the embodiment of FIG. 14, the diffraction patterns caused due to the interval between the two openings not being constant may be different, and the entire diffraction pattern is formed to be blurry as each diffraction pattern is mixed. In addition, because the elliptical openings OPBMr, OPBMg, and OPBMb of the light blocking layer 220 are arranged in the various angles, the directions of the diffraction pattern are also varied and mixed with each other to be blurry, resulting in a scattering effect. As a result, it may be difficult for the user to easily view the diffraction pattern, and the degree of the display quality deterioration may be reduced.

As described above, various embodiments of the present disclosure have been classified and described focusing on whether the openings OPr, OPg, and OPb of the pixel definition layer 380 and the openings OPBMr, OPBMg, and OPBMb of the light blocking layer 220 are in contact with each other on a plane (e.g., in a plan view), or all or a part of the openings OPr, OPg, and OPb of the pixel definition layer 380 are positioned within the opening OPBMr, OPBMg, and OPBMb of the light blocking layer 220 on a plane (e.g., in a plan view).

The embodiments described above may each improve the reflection diffraction characteristic of the external light by varying the arrangement of the long axis directions of the openings OPBMr, OPBMg, and OPBMb of the light blocking layer 220, or by varying the eccentricity of the ellipse shape thereof.

Hereinafter, one or more embodiments for varying the eccentricity of the ellipse shape and the arrangement of the long axis direction is described in more detail with reference to FIG. 16 and FIG. 17.

Figure 16:
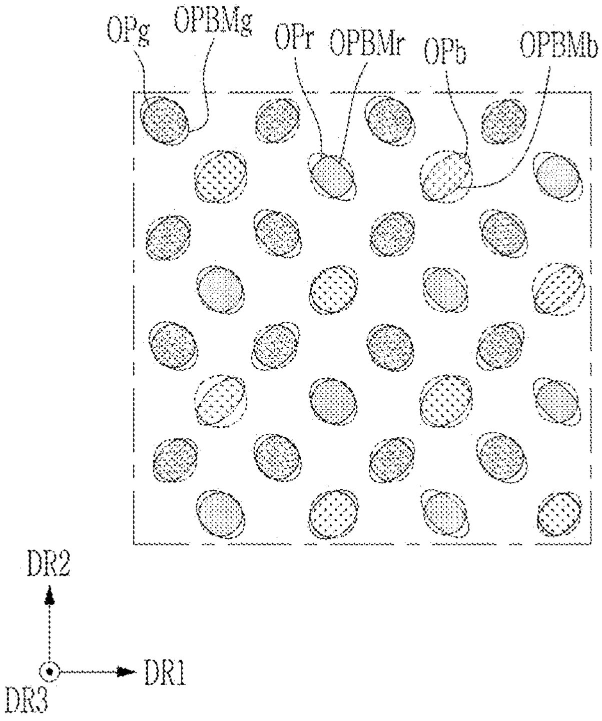
FIG. 16 and FIG. 17 are top plan views of a portion of a display panel according to an embodiment.
Figure 17:
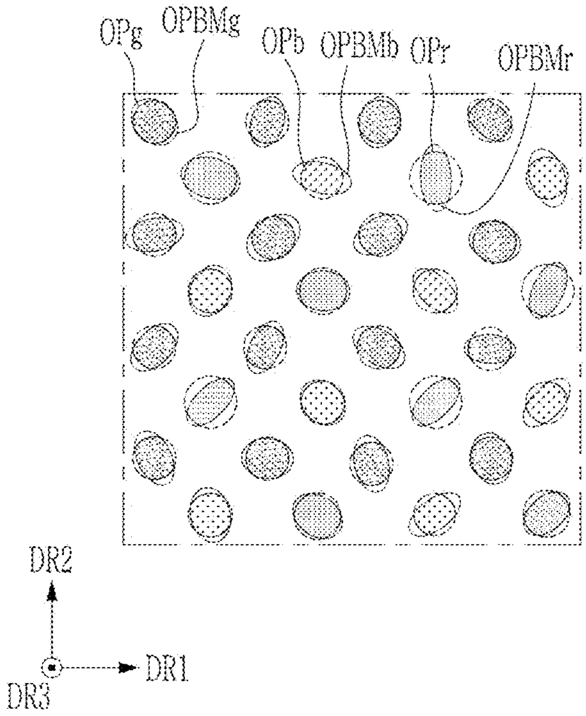

FIG. 16 and FIG. 17 are top plan views of a portion of a display panel according to an embodiment.

FIG. 16 illustrates an embodiment in which the openings OPBM of the light blocking layer 220 is formed with various eccentricities. FIG. 17 is an embodiment in which the openings OPBM of the light blocking layer 220 has various angles and is formed with various eccentricities. According to some embodiments, the openings OPBM of the light blocking layer 220 may be formed with the same eccentricity, but may with various angles.

Referring to FIG. 16, an embodiment in which the openings OPBMr, OPBMg, and OPBMb of the light blocking layer 220 are formed in an elliptical shape of two or more different eccentricities is illustrated. According to an embodiment, each opening of the same color may also be formed in an elliptical shape of two or more eccentricities. Here, referring to FIG. 21, the eccentricity of the elliptical shape may have a range of 0.2 or more and 0.85 or less.

In FIG. 16, the long axis direction of the ellipse has only two directions forming 45 degrees with respect to a first direction DR1 or a second direction DR2. According to an embodiment, 5 or fewer directions may be formed.

The planar structure of the openings OPBMr, OPBMg, and OPBMb of the light blocking layer 220 is described in more detail with reference to FIG. 16.

In FIG. 16, the openings OPr, OPg, and OPb of the pixel definition layer 380 have a circular shape, and the openings OPBMr, OPBMg, and OPBMb of the light blocking layer 220 have an elliptical planar shape. A part of the openings OPr, OPg, and OPb of the pixel definition layer 380 does not overlap with the corresponding openings OPBMr, OPBMg, and OPBMb of the light blocking layer 220 on a plane (e.g., in a plan view), and are covered by the light blocking layer 220.

The openings OPBMr, OPBMg, and OPBMb of the light blocking layer 220 are arranged with an elliptical long axis direction in two directions forming 45 degrees with respect to the first direction DR1 or the second direction DR2.

Each of the red opening OPBMr, the green opening OPBMg, and the blue opening OPBMb of the light blocking layer 220 may be formed as an ellipse having at least two different eccentricities. Also, in the embodiment of FIG. 16, the openings OPBMr, OPBMg, and OPBMb of the light blocking layer 220 of the same color may also have an elliptical planar shape having at least two different eccentricities.

In the embodiment of FIG. 16, the openings have the same color, but two or more elliptical shapes with different eccentricities may be disposed at various positions with different ratios. According to an embodiment, the same number of the elliptical shapes having different eccentricities may be included in the display area, or the different numbers may be included according to an embodiment.

Referring to FIG. 16, an angle formed by each long axis of a plurality of openings OPBMr, OPBMg, and OPBMb of the light blocking layer 220 forms 45 degrees with respect to the first direction DR1 and the second direction DR2. In the embodiment in which the eccentricity of the ellipse is formed variously, the number of the angles formed by the long axis of the ellipse may be five or fewer. In other words, in the embodiment of FIG. 16, various elliptical shapes with the different eccentricity are formed in order to reduce the color separation of the external light or to generate the constant diffraction pattern or color separation regardless of the angle. Therefore, the embodiment of FIG. 16 may enable the constant color separation and/or the constant diffraction without varying the long axis direction of the ellipse.

In FIG. 17, the openings OPBMr, OPBMg, and OPBMb of the light blocking layer 220 are formed in the elliptical shapes of the different eccentricities even for the same color, the angle formed by the long axis of each of the openings OPBMr, OPBMg, and OPBMb of the light blocking layer 220 has five angles or more, or the angle formed by the long axis is disposed with an angle interval of 36 degrees or less. Here, the eccentricity of the elliptical shape, referring to FIG. 21, may have a range of 0.2 or more and 0.85 or less.

In the embodiment of FIG. 17, the long axis direction of the ellipse is also varied while varying the eccentricity of the ellipse, Therefore, while a plurality of openings OPr, OPg, and OPb of the pixel definition layer 380 or a plurality of openings OPBMr, OPBMg, and OPBMb of the light blocking layer 220 have the long axis directions of 5 or more or are disposed with the angle interval of 36 degrees or less, as the various eccentricities of the ellipse are additionally formed, the color separation of the external light may be caused less or the constant and non-clear diffraction pattern may be caused regardless of the angle. According to embodiments, the long axis directions of a plurality of openings OPBMr, OPBMg, and OPBMb of the light blocking layer 220 may be formed with the equal interval or the non-equal interval.

Although FIG. 16 and FIG. 17 show modified embodiments based on the embodiment illustrated in FIG. 13, the embodiment of FIG. 7 or FIG. 11 may also be modified in the same or substantially the same way.

When the above embodiments of FIG. 16 and FIG. 17 are schematically compared and described as a table by including an additional embodiment that variously forms only the long axis direction of the ellipse while keeping the eccentricity constant, it may be illustrated as Table 1 below.

TABLE 1

| | Basic embodiment | FIG. 16 embodiment | FIG. 17 embodiment |
|---|---|---|---|
| Pixel definition layer opening | Circular | Circular | Circular |
| Ellipse opening eccentricity of light blocking layer | Same eccentricity for red, green, blue | Two eccentricities or more<br>Different eccentricities for each color<br>Different eccentricities for even openings of same color<br>(circle with eccentricity of 0 is also possible) | Two eccentricities or more<br>Different eccentricities for each color<br>Different eccentricities for even openings of same color<br>(circle with eccentricity of 0 is also possible) |
| Opening area (aperture ratio) of light blocking layer | Same | Different areas depending on eccentricity | Different areas depending on eccentricity |
| Dispose ratio | Evenly disposed | Total number of ellipses with different eccentricities is the same or different | Total number of ellipses with different eccentricities is the same or different |
| Long axis angle of ellipse opening of light blocking layer | Five or more | Total two angles of 45 degree<br>(5 or fewer angles are also possible) | 5 angles or more |

Hereinafter, to form a diffraction pattern regardless of an angle, a desired number of various angled elliptical structures that may be used is described in more detail with reference to FIG. 18 and FIG. 19.

Figure 18:
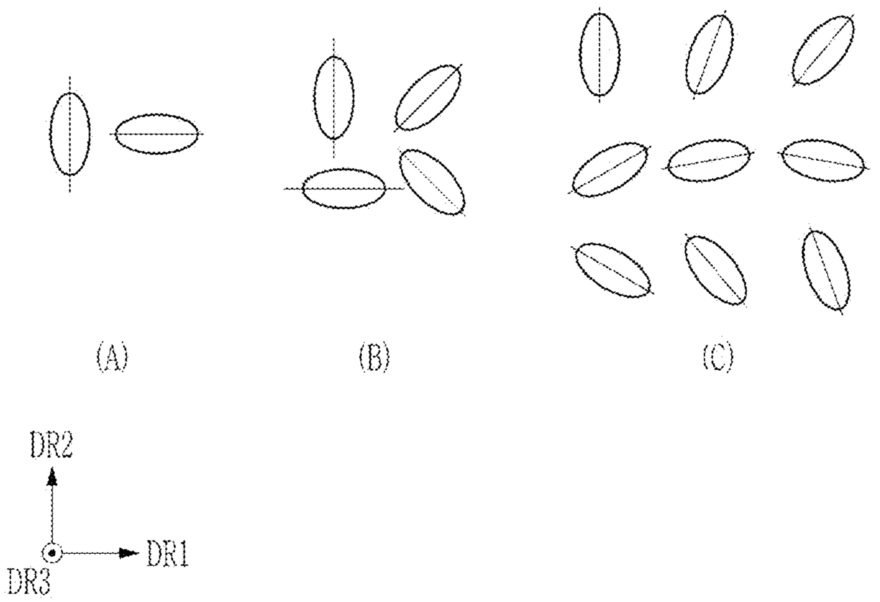
FIG. 18 is a view showing various angle arrangements according to one or more embodiments.

FIG. 18 is a view showing various angle arrangements according to one or more embodiments. FIG. 19 is a photograph of a reflection characteristic according to an angle.

FIG. 18 shows the long axis directions of a set of ellipses that may be formed in one display area.

The example (A) in FIG. 18 shows an embodiment in which the opening OPBM of the light blocking layer 220 has two long axis directions, and the two long axis directions are arranged with the angle interval of 90 degrees.

The example (B) in FIG. 18 shows an embodiment in which the opening OPBM of the light blocking layer 220 has four long axis directions, and the four long axis directions are arranged with the angle interval of 45 degrees.

The example (C) in FIG. 18 shows an embodiment in which the opening OPBM of the light blocking layer 220 has nine long axis directions, and the nine long axis directions are arranged with the angle interval of 20 degrees.

In addition to the long axis directions shown in FIG. 18, various suitable long axis directions arranged with various suitable angle intervals may be formed, and if the number of long axis directions is small, because the diffraction pattern may differ depending on the angle, the change in the diffraction pattern depending on the angle may be eliminated or reduced by including more than a certain number of the long axis angles.

To confirm this, FIG. 19 shows the diffraction patterns according to the number of various long axis directions.

The example (A) in FIG. 19 is the diffraction pattern of an embodiment having four long axis angles like that of the example (B) of FIG. 18. The example (B) of FIG. 19 is the diffraction pattern of an embodiment having five long axis angles. The example (C) of FIG. 19 is the diffraction pattern of an embodiment having six long axis angles. The example (D) of FIG. 19 is the diffraction pattern of an embodiment having seven long axis angles. The example (E) of FIG. 19 is the diffraction pattern of an embodiment having eight long axis angles.

In order to have the diffraction pattern independent of a direction from among FIG. 19, it is better to have the diffraction pattern close to a circular shape, in the example (A) of FIG. 19, it may be confirmed that there is a difference in the diffraction characteristic and the color separation depending on the direction with the protruded shape. In the example (B) to the example (E) of FIG. 19, the circular diffraction pattern is formed, and the direction-independent diffraction characteristic and color separation are formed. Therefore, based on FIG. 19, if the opening OP of the pixel definition layer 380 or the opening OPBM of the light blocking layer 220 is formed to have 5 or more long axis angles, a constant diffraction pattern or color separation occurs regardless of the angle, so that the display quality may be improved. Here, in the embodiments having five long axis angles, the long axis angles are disposed with the angel interval of 36 degrees. Therefore, in the embodiments having 5 or more long axis angles, the long axis angles may be disposed with the angle interval of 36 degrees or less.

In the above, the angle interval between the angles of the long axis of the ellipse and the number of the angles have been examined.

In the following, based on FIG. 20 and FIG. 21, a change of the reflection characteristics according to the change of the eccentricity of the ellipse is described in more detail.

Figure 20:
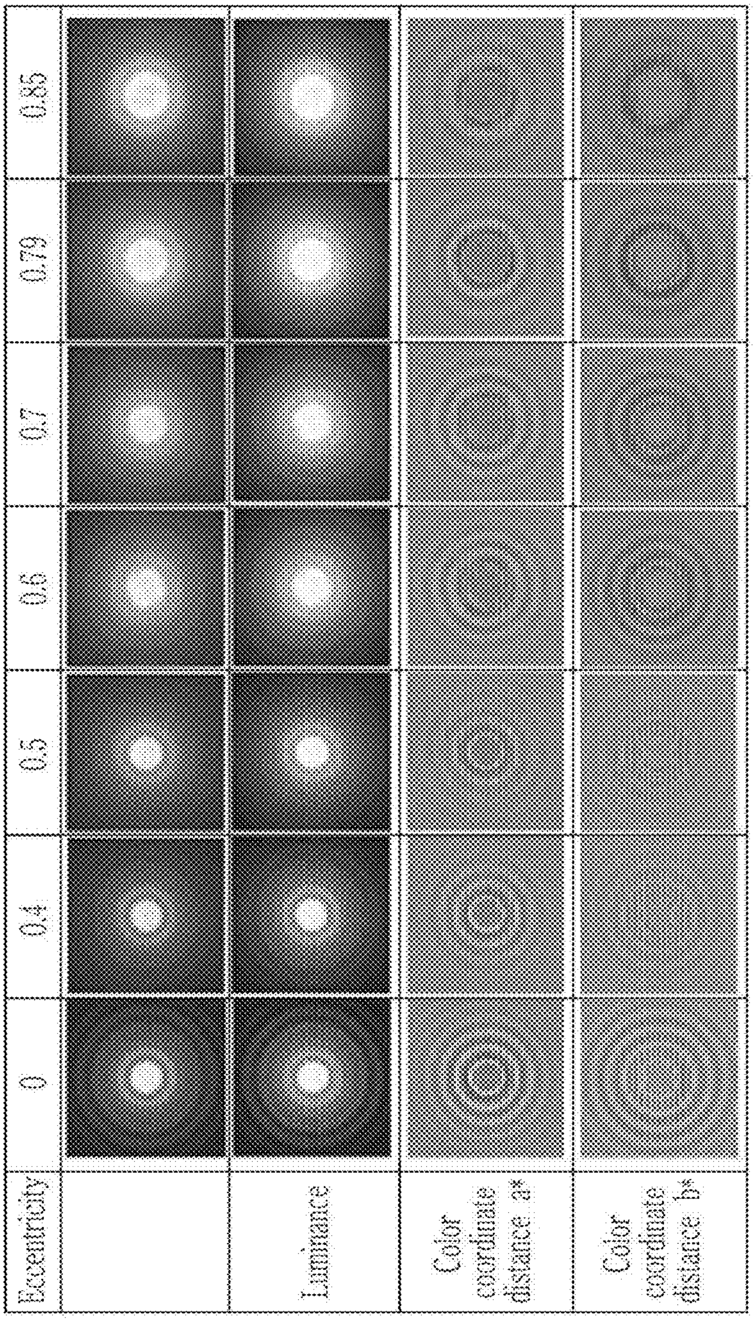
FIG. 20 and FIG. 21 are views showing reflection characteristics according to eccentricity.
Figure 21:
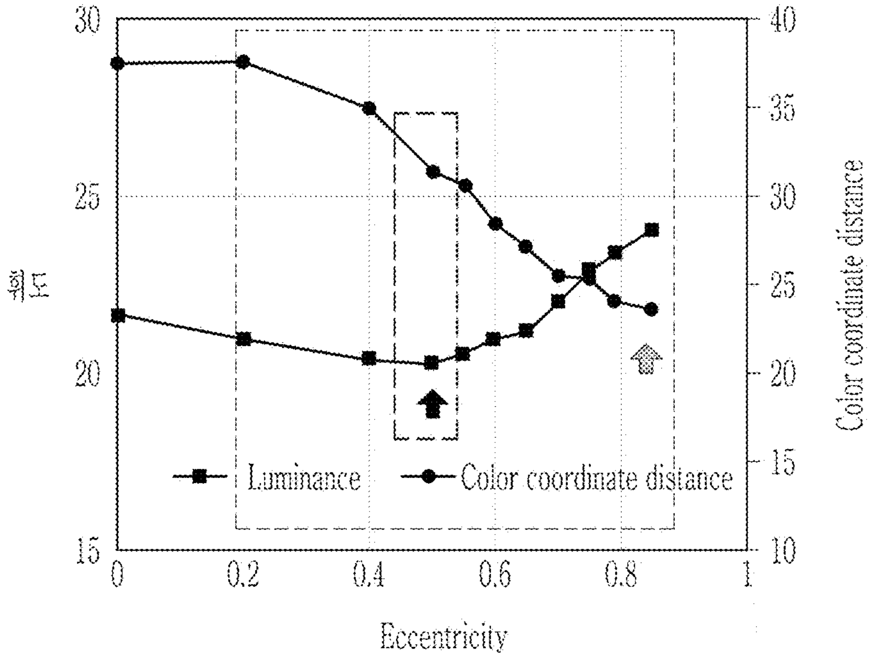

FIG. 20 and FIG. 21 are views showing reflection characteristics according to eccentricity.

FIG. 20 shows a view in which a luminance distribution and two axis of a color coordinate distribution are extracted for the color diffraction pattern of the reflected light according to the value of the eccentricity, respectively, and on this basis, FIG. 21 shows a graph of a standard deviation value of luminance and a distance value on color coordinates based on the eccentricity.

In FIG. 20 and FIG. 21, the smaller the distance value on the luminance distribution and the color coordinates, the weaker the diffraction is. In FIG. 21, the arrow indicates the position with the smallest distance value on the luminance spread or color coordinates. Referring to FIG. 20 and FIG. 21, it may be confirmed that when the eccentricity is 0.5, it has the smallest luminance distribution value and may be an improvement even considering the color coordinate distribution. Also, referring to FIG. 21, in the area where the eccentricity is partitioned by a dotted line, or in other words, in the range of 0.2 or more and 0.85 or less, it is judged that the luminance distribution and the color coordinate distribution do not significantly deteriorate the display quality, so that the elliptical shape of the eccentricity with this range may be applied.

In the above, the opening OPBM of the light blocking layer 220 has been examined centering on embodiments having one eccentricity.

According to an embodiment, at least two elliptical shapes having different eccentricities may be merged to form the opening OPBM of the one light blocking layer 220, which is described in more detail with reference to FIG. 22 to FIG. 24.

First, a basic shape of the ellipse and an arrangement of the openings based on the shape of the ellipse are described in more detail with reference to FIG. 22 and FIG. 23.

Figure 22:
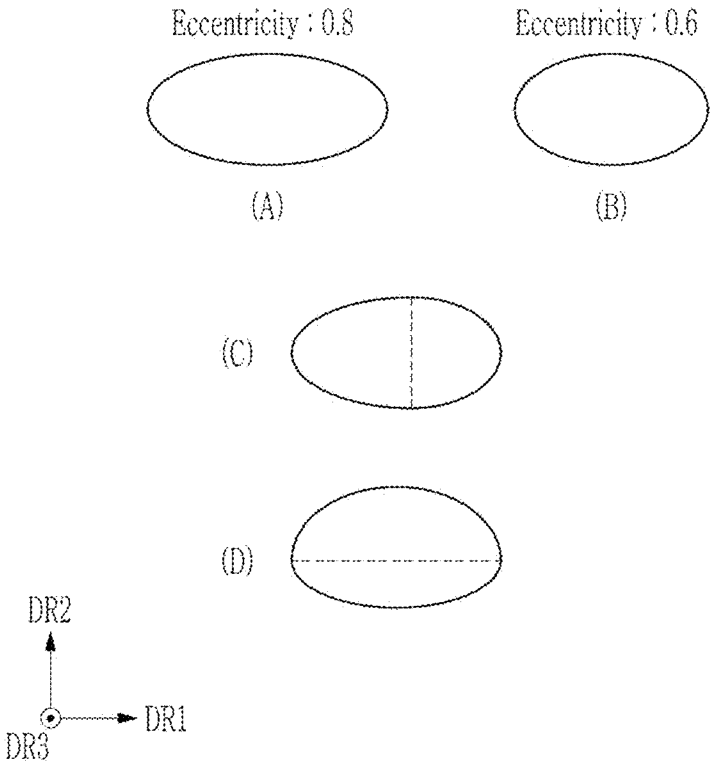
FIG. 22 and FIG. 23 are views showing a structure in which ellipses with different eccentricities are merged.
Figure 23:
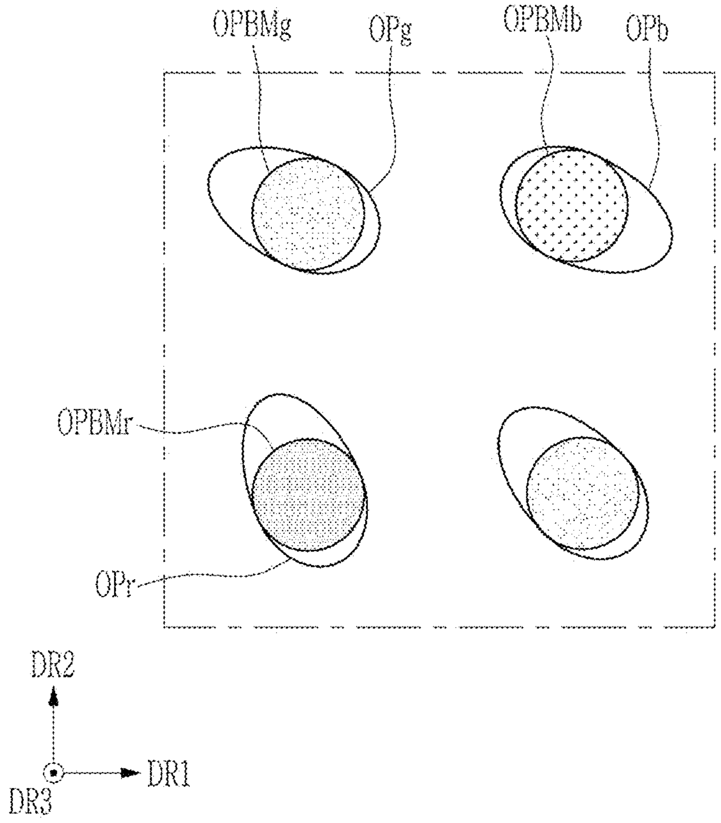

FIG. 22 and FIG. 23 are views illustrating various structures in which ellipses with different eccentricities are merged.

FIG. 22 illustrates examples of merging two or more elliptical shapes with different eccentricities, and merging two different elliptical shapes.

The examples (A) and (B) in FIG. 22 show the elliptical shapes with the different eccentricities, and the examples (C) and (D) in FIG. 22 show the ellipses that are merged with two ellipse shapes with the different eccentricities in different suitable ways.

The example (A) in FIG. 22 shows the ellipse with the eccentricity of 0.8, and the example (B) in FIG. 22 shows the elliptical shape with the eccentricity of 0.6. The ellipse merging these two ellipses may have the shapes as shown in the examples (C) or (D) of FIG. 22.

The examples (C) and (D) of FIG. 22 show a dotted line within the merged ellipse shape, and the ellipses on opposite sides of the dotted line is a part of the ellipses with the different eccentricity.

In other words, the example (C) of FIG. 22 is an example of combining the ellipses after cutting the ellipses of the example (A) and the example (B) of FIG. 22 along the second direction DR2. The example (D) of FIG. 22 is an example of combining the ellipses after cutting the ellipses of the example (A) and the example (B) of FIG. 22 along the first direction DR1. A method of combining two ellipses having the different eccentricities is not limited thereto, and they may be combined in various suitable ways.

An example of arranging the openings OPBMr, OPBMg, and OPBMb of the light blocking layer 220 and the openings OPr, OPg, and OPb of the pixel definition layer 380 in the various suitable long axis directions by using the ellipse shapes merged in the same or substantially the same way as that illustrated in the example (C) of FIG. 22 is shown in FIG. 23.

FIG. 23 shows one unit pixel, and the one unit pixel includes one red opening (OPr, OPBMr), one blue opening (OPb, OPBMb), and two green openings (OPg, OPBMg).

In the embodiment of FIG. 23, the openings OPr, OPg, and OPb of the pixel definition layer 380 are formed in a circular shape, and the openings OPBMr, OPBMg, and OPBMb of the light blocking layer 220 are formed in a merged elliptical shape, such that each long axis direction thereof may be different from the others.

In the embodiment using the ellipse obtained by combining two ellipses having the different eccentricities as shown in FIG. 23, as shown in FIG. 19, the angle formed by each long axis of the openings OPr, OPg, and OPb of the pixel definition layer 380 and the openings OPBMr, OPBMg, and OPBMb of the light blocking layer 220 may have five angles or more, and the angle formed by the long axis may be disposed with the angle interval less than 36 degrees.

Also, because the eccentricity of two ellipses used for merging may vary, the size of the merged ellipse may also vary. In addition, according to an embodiment, two ellipses of the different eccentricity may be combined for each color, and the various ellipses may be formed by combining two ellipses of the different eccentricity even in the same color.

Here, the eccentricities of the openings OPr, OPg, and OPb of the pixel definition layer 380 and/or the openings OPBMr, OPBMg, and OPBMb of the light blocking layer 220, as shown in FIG. 20 and FIG. 21, may have the eccentricity of 0.2 or more and 0.85 or less.

The long axis directions of the openings OPr, OPg, and OPb of the pixel definition layer 380 and the corresponding openings OPBMr, OPBMg, and OPBMb of the light blocking layer 220 may be the same or substantially the same, or may form an angle of less than 10 degrees due to a processing error.

The openings OPr, OPg, and OPb of the pixel definition layer 380 and the corresponding openings OPBMr, OPBMg, and OPBMb of the light blocking layer 220 may have a regular interval on a plane (e.g., in a plan view) or a horizontal interval of 4.5 μm or more and 10 μm.

Hereinafter, the diffraction characteristics of the reflected light for an embodiment (e.g., the example (A) of FIG. 24) using the ellipse shape merged in the same or substantially the same way as that illustrated in the example (C) of FIG. 22 is described in more detail.

Figure 24:
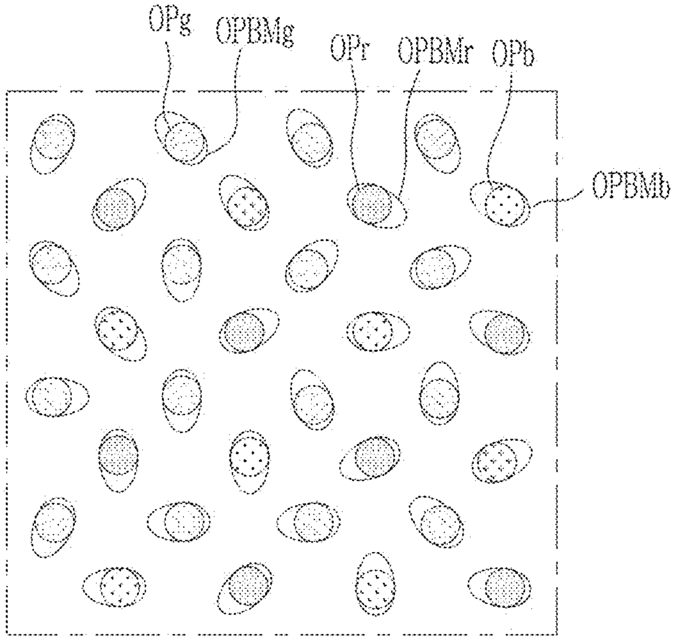
FIG. 24 illustrates views showing a merged elliptical structure and a reflection characteristic thereof according to an embodiment.
Figure 24:
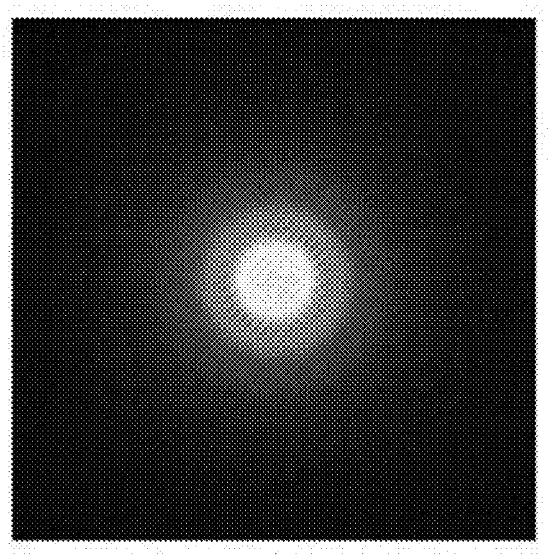

FIG. 24 is a view showing a merged elliptical structure and a reflection characteristic thereof according to an embodiment.

The example (A) in FIG. 24 shows an embodiment in which the openings of each color all have the same merged elliptical shape, but the long axis direction has more than 5 angles.

The example (B) of FIG. 24 shows the diffraction characteristic of the reflected light in the example (A) of FIG. 24. Compared with the comparative example (A) of FIG. 15, it may be confirmed that the diffraction characteristic of the example (B) if FIG. 24 has a blurry reflection diffraction pattern, so that a ring shape may be less distinct and the color separation may be difficult for the user to easily see. As a result, the example (A) of FIG. 24 according to an embodiment may also have the improved display quality compared to the comparative example.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

| Description of symbols | |
|---|---|
| 380: pixel definition layer | 220: light blocking layer |
| OP, OPr, OPg, OPb: pixel definition layer opening | |
| OPBM, OPBMr, OPBMg, OPBMb: light blocking layer opening | |
| 230, 230R, 230G, 230B: color filter | |
| Anode: anode | Cathode: cathode |
| EML: emission layer | FL: functional layer |
| 1000: display device | DP: display panel |
| 110: substrate | 180: organic layer |
| 385, 385-1, 385-2: spacer | 400, 401, 402, 403: encapsulation layer |
| 501, 510, 511: detecting insulating layer | 540, 541: detecting electrode |
| 550: planarization layer | DA, DA1-1, DA1-2: display area |
| EA, EA1, EA2: component area | |

What is claimed is:

1. A light emitting display device comprising:

a substrate;

a plurality of anodes on the substrate;

a pixel definition layer having a plurality of first openings overlapping with the plurality of anodes, respectively;

a plurality of emission layers located within the plurality of first openings of the pixel definition layer, respectively;

a cathode on the plurality of emission layers and the pixel definition layer;

an encapsulation layer on the cathode; and a light blocking layer on the encapsulation layer, and having a plurality of second openings corresponding to the plurality of first openings, respectively, wherein each of the plurality of first openings has a circular shape in a plan view, and each of the plurality of second openings has an elliptical shape in a plan view, and wherein, in a plan view, a first opening from among the plurality of first openings is in contact with a second opening corresponding to the first opening from among the plurality of second openings, or positioned within the second opening.

2. The light emitting display device of claim 1, wherein a half value of a long axis length of the elliptical shape of the second opening is greater than a radius value of the circular shape of the first opening by 4.5 μm or more and 10 μm or less.

3. The light emitting display device of claim 1, wherein the plurality of second openings have long axis angles including five or more directions.

4. The light emitting display device of claim 3, wherein an angle formed by long axis directions of each ellipse for two second openings from among the plurality of second openings is 36 degrees or less.

5. The light emitting display device of claim 3, wherein the plurality of second openings have long axis directions of eight angles, and an angular interval of 22.5 degrees.

6. The light emitting display device of claim 3, wherein the plurality of second openings have long axis directions with 16 angles, and an angular interval of 11.25 degrees.

7. The light emitting display device of claim 1, wherein each of the plurality of second openings has an eccentricity greater than or equal to 0.2 and less than or equal to 0.85.

8. The light emitting display device of claim 7, further comprising a color filter located within each of the plurality of second openings, wherein the color filter comprises a color filter for a first color, a color filter for a second color, and a color filter for a third color, and wherein two second openings from among the plurality of second openings corresponding to the color filter of the same color as each other have different eccentricities from each other.

9. The light emitting display device of claim 1, wherein the second opening has a planar shape in which at least two elliptical shapes with different eccentricities from each other are merged together in a plan view.

10. The light emitting display device of claim 9, wherein the second opening has the planar shape formed by combining a first ellipse with a first eccentricity and a second ellipse with a second eccentricity together after cutting them along a first direction.

11. A light emitting display device comprising:

a substrate;

a plurality of anodes on the substrate;

a pixel definition layer having a plurality of first openings overlapping with the plurality of anodes, respectively;

a plurality of emission layers located within the plurality of first openings of the pixel definition layer, respectively;

a cathode on the plurality of emission layers and the pixel definition layer;

an encapsulation layer on the cathode; and a light blocking layer on the encapsulation layer, and having a plurality of second openings corresponding to the plurality of first openings, respectively, wherein each of the plurality of first openings has a circular shape in a plan view, and each of the plurality of second openings has an elliptical shape in a plan view, and wherein a portion of a first opening from among the plurality of first openings overlaps with a second opening corresponding to the first opening from among the plurality of second openings, while other portions of the first opening overlaps with the light blocking layer.

12. The light emitting display device of claim 11, wherein a half value of a long axis length of the elliptical shape of the second opening is greater than a radius value of the circular shape of the first opening by 4.5 μm or more and 10 μm or less.

13. The light emitting display device of claim 11, wherein the plurality of second openings have long axis angles including five or more directions.

14. The light emitting display device of claim 13, wherein an angle formed by long axis directions of each ellipse of two second openings from among the plurality of second openings is 36 degrees or less.

15. The light emitting display device of claim 13, wherein the plurality of second openings have long axis directions of eight angles, and an angular interval of 22.5 degrees.

16. The light emitting display device of claim 13, wherein the plurality of second openings have long axis directions with 16 angles, and an angular interval of 11.25 degrees.

17. The light emitting display device of claim 11, wherein each of the plurality of second openings has an eccentricity greater than or equal to 0.2 and less than or equal to 0.85.

18. The light emitting display device of claim 17, further comprising a color filter located within each of the plurality of second openings, wherein the color filter comprises a color filter for a first color, a color filter for a second color, and a color filter for a third color, and wherein two second openings from among the plurality of second openings corresponding to the color filter of the same color as each other have different eccentricities from each other.

19. The light emitting display device of claim 11, wherein the second opening has a planar shape in which at least two elliptical shapes with different eccentricities from each other are merged together in a plan view.

20. The light emitting display device of claim 19, wherein the second opening has the planar shape formed by combining a first ellipse with a first eccentricity and a second ellipse with a second eccentricity together after cutting them along a first direction.

* * * * *